(12) United States Patent
D'Evelyn et al.

(10) Patent No.: US 7,582,498 B2
(45) Date of Patent: Sep. 1, 2009

(54) RESONANT CAVITY LIGHT EMITTING DEVICES AND ASSOCIATED METHOD

(75) Inventors: Mark Philip D'Evelyn, Niskayuna, NY (US); Xian-An Cao, New Paltz, NY (US); Anping Zhang, Niskayuna, NY (US); Steven Francis LeBoeuf, Schenectady, NY (US); Huicong Hong, Niskayuna, NY (US); Dong-Sil Park, Niskayuna, NY (US); Kristi Jean Narang, Voorheesville, NY (US)

(73) Assignee: Momentive Performance Materials Inc., Albany, NY (US)

( * ) Notice: Subject to any disclaimer, the term of this patent is extended or adjusted under 35 U.S.C. 154(b) by 46 days.

(21) Appl. No.: 11/295,627

(22) Filed: Dec. 6, 2005

(65) Prior Publication Data

US 2006/0118799 A1    Jun. 8, 2006

Related U.S. Application Data

(63) Continuation-in-part of application No. 10/693,803, filed on Oct. 24, 2003, now Pat. No. 7,009,215.

(51) Int. Cl.
*H01L 21/00* (2006.01)
*C30B 15/00* (2006.01)

(52) U.S. Cl. .................. 438/46; 438/47; 257/E21.117; 117/216

(58) Field of Classification Search .................. 438/46, 438/47; 117/952, 206, 216; 257/E21.117
See application file for complete search history.

(56) References Cited

U.S. PATENT DOCUMENTS 5,578,839 A    11/1996    Nakamura et al.

(Continued)

FOREIGN PATENT DOCUMENTS

DE    10208 170    9/2003

(Continued)

OTHER PUBLICATIONS

S. Porowski, "Near Defect Free GaN Substrates", MRS Internet Journal Nitride Semiconductor Research 4S1, Article G1.3, 1999.

(Continued)

*Primary Examiner*—Lex Malsawma
(74) *Attorney, Agent, or Firm*—Joseph E. Waters

(57) ABSTRACT

A method may produce a resonant cavity light emitting device. A seed gallium nitride crystal and a source material in a nitrogen-containing superheated fluid may provide a medium for mass transport of gallium nitride precursors therebetween. A seed crystal surface may be prepared by applying a first thermal profile between the seed gallium nitride crystal and the source material. Gallium nitride material may be grown on the prepared surface of the seed gallium nitride crystal by applying a second thermal profile between the seed gallium nitride crystal and the source material while the seed gallium nitride crystal and the source material are in the nitrogen-containing superheated fluid. A stack of group III-nitride layers may be deposited on the single-crystal gallium nitride substrate. The stack may include a first mirror substack and an active region adaptable for fabrication into one or more resonant cavity light emitting devices.

32 Claims, 14 Drawing Sheets

U.S. PATENT DOCUMENTS

| | | | |
|---|---|---|---|
| 5,637,531 | A | 6/1997 | Porowski et al. |
| 5,770,887 | A | 6/1998 | Tadatomo et al. |
| 5,796,771 | A | 8/1998 | DenBaars et al. |
| 5,810,925 | A | 9/1998 | Tadatomo et al. |
| 5,838,707 | A | 11/1998 | Ramdani et al. |
| 5,874,747 | A | 2/1999 | Redwing et al. |
| 5,877,038 | A | 3/1999 | Coldren et al. |
| 5,962,975 | A | 10/1999 | Lepselter |
| 5,977,612 | A | 11/1999 | Bour et al. |
| 6,015,979 | A | 1/2000 | Sugiura et al. |
| 6,031,858 | A | 2/2000 | Hatakoshi et al. |
| 6,507,042 | B1 | 1/2003 | Mukai et al. |
| 6,515,308 | B1 | 2/2003 | Kneissl et al. |
| 2002/0140845 | A1 | 10/2002 | Yoshida et al. |
| 2002/0155634 | A1 | 10/2002 | D'Evelyn et al. |
| 2002/0189531 | A1* | 12/2002 | Dwilinski et al. ............. 117/81 |
| 2003/0047744 | A1 | 3/2003 | Yanamoto |
| 2003/0141301 | A1 | 7/2003 | D'Evelyn et al. |
| 2003/0183155 | A1 | 10/2003 | D'Evelyn et al. |
| 2003/0231683 | A1* | 12/2003 | Chua et al. .................... 372/46 |
| 2004/0195598 | A1 | 10/2004 | Tysoe et al. |

FOREIGN PATENT DOCUMENTS

| | | |
|---|---|---|
| JP | 2000-022212 | 1/2000 |
| WO | WO 01/24285 | 4/2001 |
| WO | WO 01/37351 | 5/2001 |

OTHER PUBLICATIONS

Marcie G. Weinstein et al., "Hydrogen-Decorated Lattice Defects in Proton Implanted GaN", Applied Physics Letters, vol. 72, No. 14, pp. 1703-1705, Apr. 6, 1998.

M. Kamp et al., "GaN Homoepitaxy for Device Applications", MRS internet J. Nitride Semicond. Res. 4Si, G10.2, 1999.

P. Fin, "In Situ, Real-Time Measurement of Wing Tilt During Lateral Epitaxial Overgrowth of GaN", Applied Physics Letters, vol. 76, No. 26, pp. 3893-3895, Jun. 26, 2000.

Arthur Pelzmann, "Blue Light-Emitting Diodes on GaN Substrates, Growth and Characterization", Journal of Crystal Growth, 189/190, pp. 167-171, 1998.

S. Porowski, "High Pressure Crystallization of III-V Nitrides", ACTA Physica Polonica A, vol. 87, No. 2, pp. 295-302, 1995. Internet Journal Nitride Semiconductor Research 4S1, Article G1.3, 1999.

Ig-Hyeon Kim et al., "Crystal Tilting in GaN Grown by Pendoepitaxy Method on Sapphire Substrate", Applied Physics Letters, vol. 75, No. 26, pp. 4109-4111, Dec. 27, 1999.

T. S. Kuan et al., "Dislocation Mechanisms in the GaN Lateral Overgrowth by Hydride Vapor Phase Epitaxy", F99W2.6.

Co-pending U.S. Appl. No. 10/329,981, filed Dec. 27, 2002, entitled "Gallium Nitride Crystal and Method of Making Same".

Co-pending U.S. Appl. No. 60/435,189, filed Dec. 18, 2002, entitled "High Pressure high Temperature Apparatus With Improved Temperature Control for Crystal Growth".

* cited by examiner

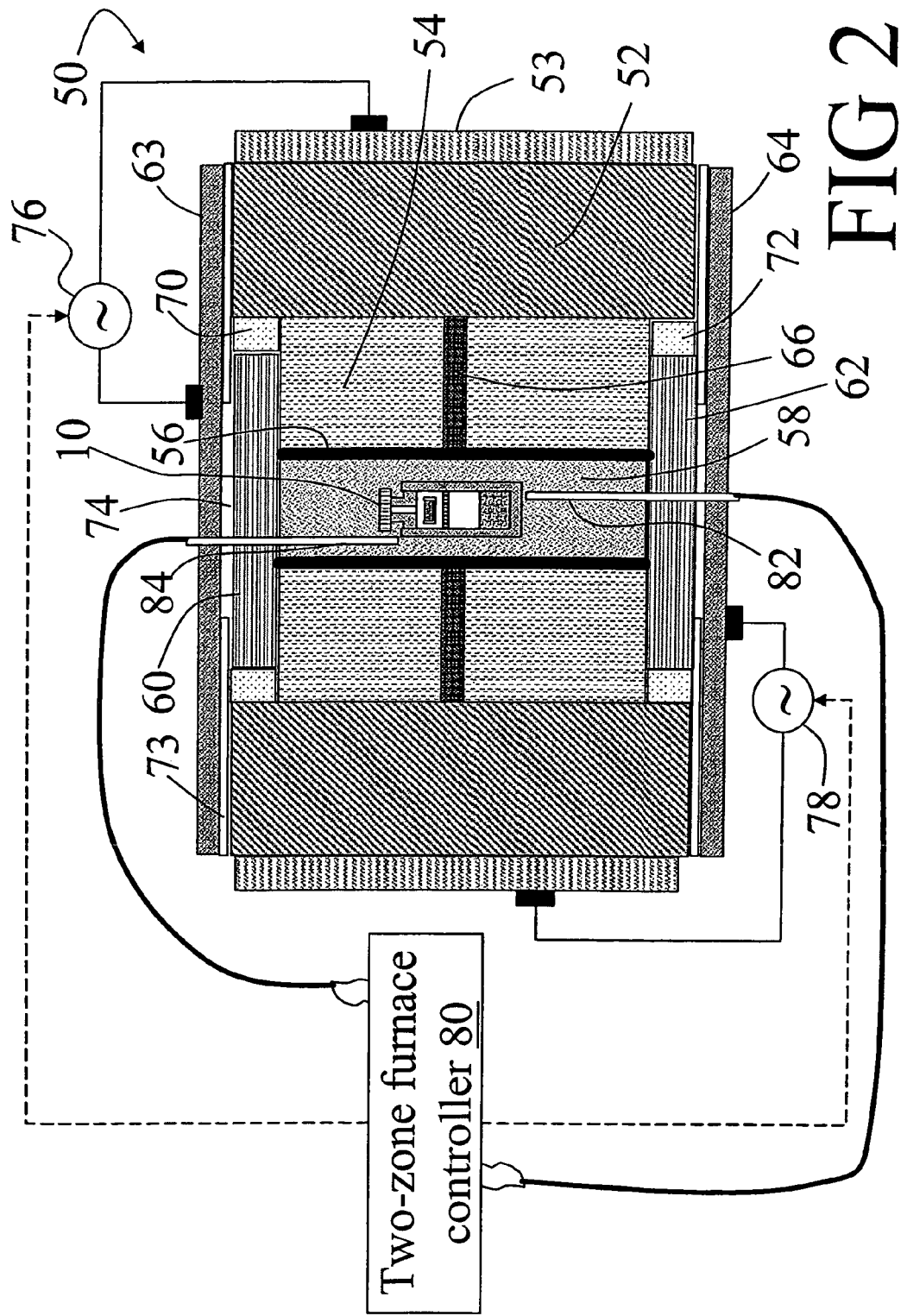

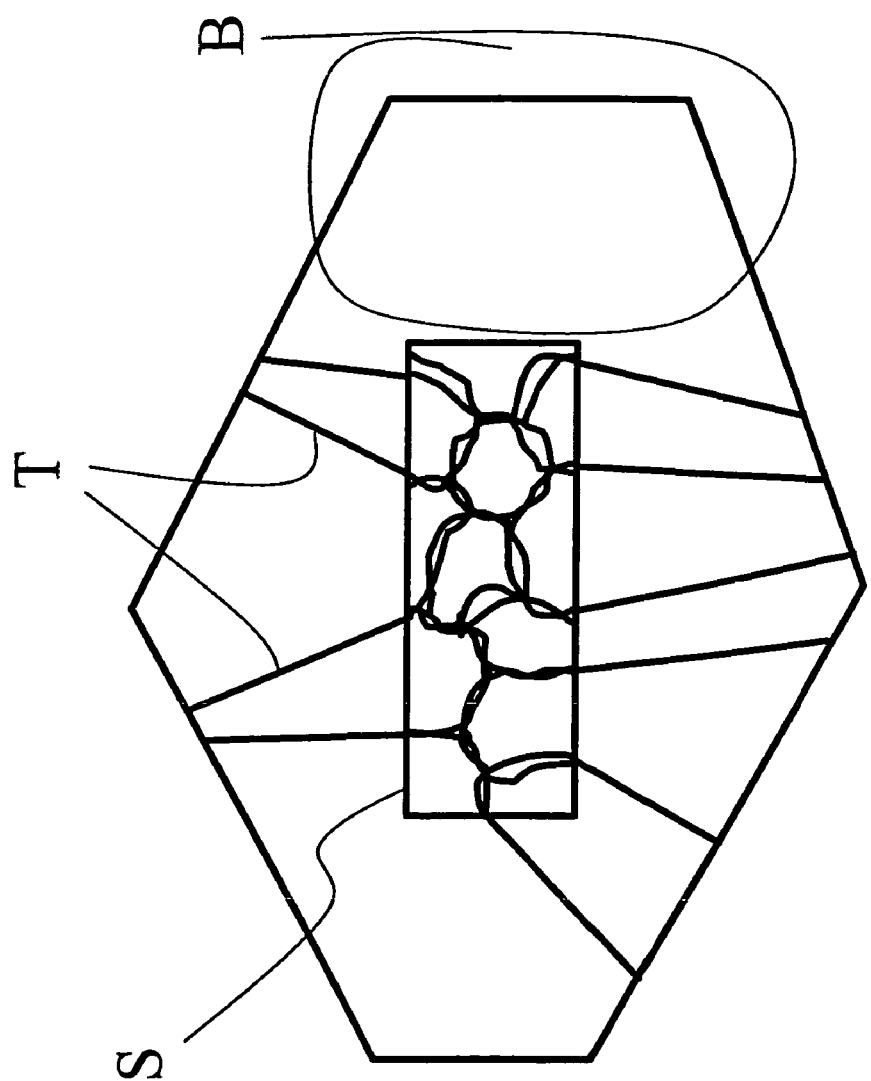

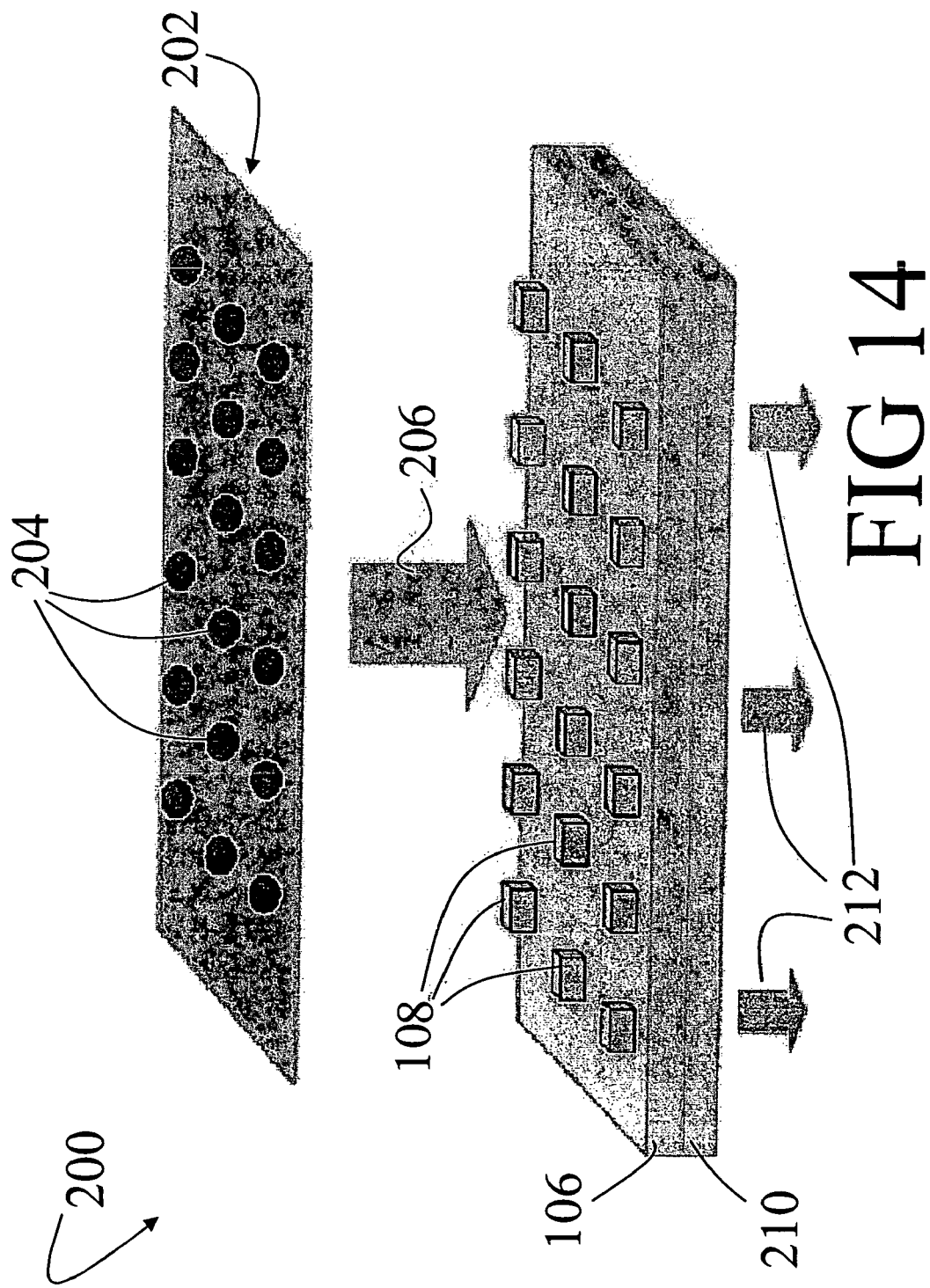

RESONANT CAVITY LIGHT EMITTING DEVICES AND ASSOCIATED METHOD

CROSS REFERENCE TO RELATED APPLICATIONS

This application may be a continuation-in-part of application Ser. No. 10/693,803, filed Oct. 24, 2003, now U.S. Pat. No. 7,009,215 and claims benefit therefrom, the contents of which may be incorporated by reference in their entirety.

BACKGROUND

1. Technical Field

The invention may include embodiments that may relate to resonant cavity light emitting devices. The invention may include embodiments that may relate to a method of making and/or using resonant cavity light emitting devices, or components thereof.

2. Discussion of Related Art

Light may be extracted from a light emitting diode (LED). The light emitting diode may emit light of only one wavelength, whereas for many applications at least one additional wavelength or white light may be desirable. The use of phosphors, such as in a polymer matrix, may generate light of additional wavelengths, but may have reduced efficiency by, for example, Stokes shifts, reflective or light-scattering losses, and device failures associated with the phosphor packaging. Resonant cavity devices may provide more efficient light extraction, but it may be difficult to fabricate reliable resonant cavity devices in the group III-nitride material system.

Gallium nitride substrate material may exhibit: (i) a close lattice match which, neglecting dopant effects, may be useful for gallium nitride device layers; (ii) reduced strain and dislocation formation in the epitaxial group III-nitride layers as a consequence of the close lattice match; (iii) chemically abrupt interfaces without problematic interdiffusion; (iv) reduction of anti-phase boundaries; and (v) thermal matching that promotes thermal stability during thermal cycling associated with high epitaxial growth temperatures, during high temperature device processing, or end use.

Using a gallium nitride wafer for growth may include: (i) economy of scale (more devices per wafer); (ii) easier handling; (iii) easier automated machine manipulation; and (iv) the ability to fabricate large-area devices. Resonant cavity light emitting diodes may be relatively smaller to a side.

In spite of these well-known advantages, commercial group III-nitride light emitting devices continue to be grown heteroepitaxially on sapphire or silicon carbide substrates due to a lack of high quality large-area gallium nitride substrates. The chemical passivity of nitrogen, a high melting temperature of gallium nitride, and other factors have heretofore made growth of a large volume and high quality gallium nitride boule problematic.

U.S. Pat. Nos. 5,637,531 and 6,273,948 disclose methods for growing gallium nitride crystals at high pressure and high temperature, using liquid gallium and gallium-based alloys as a solvent and a high pressure of nitrogen above the melt to maintain GaN as a thermodynamically-stable phase. The process may be capable of growing electrically-conductive GaN crystals with a dislocation density of about $10^3$-$10^5$ cm$^{-2}$ or, alternatively, semi-insulating GaN crystals with a dislocation density of about 10-$10^4$ cm$^{-2}$, as described by Porowski, "Near defect-free GaN substrates" [MRS Internet J. Nitride Semicond. Research 4S1, G1.3 (1999)]. However, the conductive crystals have a high n-type background doping on the order of $5 \times 10^9$ cm$^{-3}$, believed to be due to oxygen impurities and nitrogen vacancies. The high n-type background causes substantial crystal opacity, for example optical absorption coefficients of around 200 cm$^{-1}$ in the visible range, which may be problematic for flip-chip light emitters, and causes the lattice constant to increase by about 0.01 percent to about 0.02 percent, generating strain in epitaxial GaN layers deposited thereupon. The undoped GaN substrates formed by this method have a carrier mobility of about 30 to about 90 cm$^2$/V-s, which may be problematic in high-power devices.

Another technology for growth of pseudo-bulk or bulk GaN may be hydride/halide vapor phase epitaxy, also known as HVPE. In one approach, HCl reacts with liquid Ga to form vapor-phase GaCl, which may be transported to a substrate where it reacts with injected NH$_3$ to form GaN. The deposition may be performed on a non-GaN substrate such as sapphire, silicon, gallium arsenide, or LiGaO$_2$. The dislocation density in HVPE-grown films may be initially quite high, on the order of $10^{10}$ cm$^{-2}$ as may be typical for heteroepitaxy of GaN, but drops to a value of about $10^7$ cm$^{-2}$ after a thickness of 100 to about 300 micrometers of GaN has been grown. Heteroepitaxial growth of thick HVPE GaN results in strain-induced bowing during cooldown after growth, which remains even after removal of the original substrate.

In view of the difficulty in producing large gallium nitride boules, some efforts have been directed toward developing complex techniques such as epitaxial lateral overgrowth (ELO) for producing individual gallium nitride substrates. In ELO, an epitaxy-inhibiting mask may be deposited over a nucleation substrate such as a sapphire wafer. The mask may be lithographically processed to define openings. Gallium nitride growth nucleates in and fills the openings, and then grows laterally over the masked areas in a lateral overgrowth mode. ELO material has been shown to suppress dislocation densities. Optionally, the nucleation substrate may be removed and the ELO growth process may be repeated on the free-standing gallium nitride wafer. Some reports claim dislocation densities as low as $10^4$ cm$^{-2}$ obtained by ELO.

However, much higher dislocation densities remain above the openings where ELO growth initiates. Moreover, coalescence of lateral overgrowth from adjacent openings produces tilt boundaries that may manifest in thick layers as arrays of edge dislocations. Repeated application of epitaxial lateral overgrowth may not be expected to suppress the tilt boundaries. Thus, epitaxial lateral overgrowth may not be upwardly scalable in the lateral wafer dimension, and usable growth dimensions may be limited to about the order of the spacings of the nucleation openings. Furthermore, ELO does not produce a three-dimensional single-crystal boule, and the processing involved in producing each ELO gallium nitride wafer may be labor-intensive, making automation of the ELO wafer formation process difficult.

Doping of GaN by rare earth metals may produce luminescence. For example, Lozykowski et al. (U.S. Pat. No. 6,140,669) disclose incorporating rare earth ions into GaN layers by ion implantation, MOCVD, or MBE, and annealing at 1000 degrees Celsius or greater. Birkhahn et al. (U.S. Pat. No. 6,255,669) disclose fabrication of light-emitting diodes using GaN layers doped with a rare earth ion or with chromium. However, these references focus on thin GaN epitaxial layers rather than bulk crystals and do not relate to resonant cavity devices.

Mueller-Mach et al. (WO 01/24285 A1) disclose the fabrication of GaN-based light-emitting diodes on a single crystal phosphor substrate, preferably, rare-earth-doped yttrium aluminum garnet. DenBaars et al. (WO 01/37351 A1) disclose the fabrication of GaN-based light-emitting diode structures, including a vertical laser structure, on a substrate doped with chromium or other transition or rare earth ions. However, the disclosed laser structure employs only a single cavity and has no capability for directional emission of two or more visible wavelengths of light or of white light.

BRIEF SUMMARY

In one embodiment, a method may produce a resonant cavity light emitting device. A seed metal nitride crystal and a source material may be arranged in a nitrogen-containing superheated fluid that provides a medium for mass transport of gallium nitride precursors. A surface of the seed metal nitride crystal may be prepared by applying a first thermal profile between the seed crystal and the source material. Metal nitride material may be grown on the prepared surface of the seed crystal. The growing may include applying a second thermal profile which may be different from the first thermal profile between the seed crystal and the source material while the seed crystal and the source material may be arranged in the nitrogen-containing superheated fluid. Said growing produces a single-crystal metal nitride substrate. A stack of group III-nitride layers may be deposited on the single-crystal metal nitride substrate. The stack may include a first mirror sub-stack and an active region adapted for fabrication into one or more resonant cavity light emitting devices.

In one embodiment, a method may provide a resonant cavity light emitting device. A seed metal nitride crystal and a source material may be arranged in a nitrogen-containing superheated fluid disposed in a sealed container disposed in a multiple-zone furnace. Metal nitride material may be grown on the seed crystal by mass transport from the source material to the seed crystal through the nitrogen-containing superheated fluid. Said growing produces a single-crystal metal nitride substrate secured to the seed crystal. Said growing may include applying a temporally and/or spatially varying thermal gradient between the seed crystal and the source material to produce an increasing growth rate during at least a portion of the growing. A stack of group III-nitride layers may deposit on the single-crystal metal nitride substrate. The stack may include a first mirror sub-stack and an active region adapted for fabrication into one or more resonant cavity light emitting devices.

A system for implementing one or methods may be provided.

BRIEF DESCRIPTION OF THE DRAWINGS

The invention may take form in various components and arrangements of components, and in various process operations and arrangements of process operations. The drawings may illustrate embodiments and do not limit the invention. In the drawings of the resonant cavity light emitting devices, layer thicknesses and lateral dimensions may not be drawn to scale.

FIG. 2 shows a cross-sectional view of a pressure vessel including a two-zone furnace for use in conjunction with the capsule of FIG. 1 in growing a low dislocation density single crystal gallium nitride substrate boule that may be free of tilt boundaries.

FIG. 5B diagrammatically shows the seed crystal and grown bulk GaN of FIG. 5A viewed along the direction L indicated in FIG. 5A.

FIG. 14 shows a light emitting array component including the plurality of resonant cavity light emitting devices fabricated on the low dislocation density single crystal gallium nitride wafer of FIG. 6A.

DETAILED DESCRIPTION

The invention may include embodiments that may relate to resonant cavity light emitting devices. The invention may include embodiments that may relate to a method of making and/or using resonant cavity light emitting devices, or components thereof.

Approximating language, as used herein throughout the specification and claims, may be applied to modify any quantitative representation that could permissibly vary without resulting in a change in the basic function to which it is related. Accordingly, a value modified by a term such as "about" is not to be limited to the precise value specified, and may include values that differ from the specified value. In at least some instances, the approximating language may correspond to the precision of an instrument for measuring the value. Similarly, "free" may be used in combination with a term, and may include an insubstantial number, or trace amounts, while still being considered free of the modified term.

Figure 1:
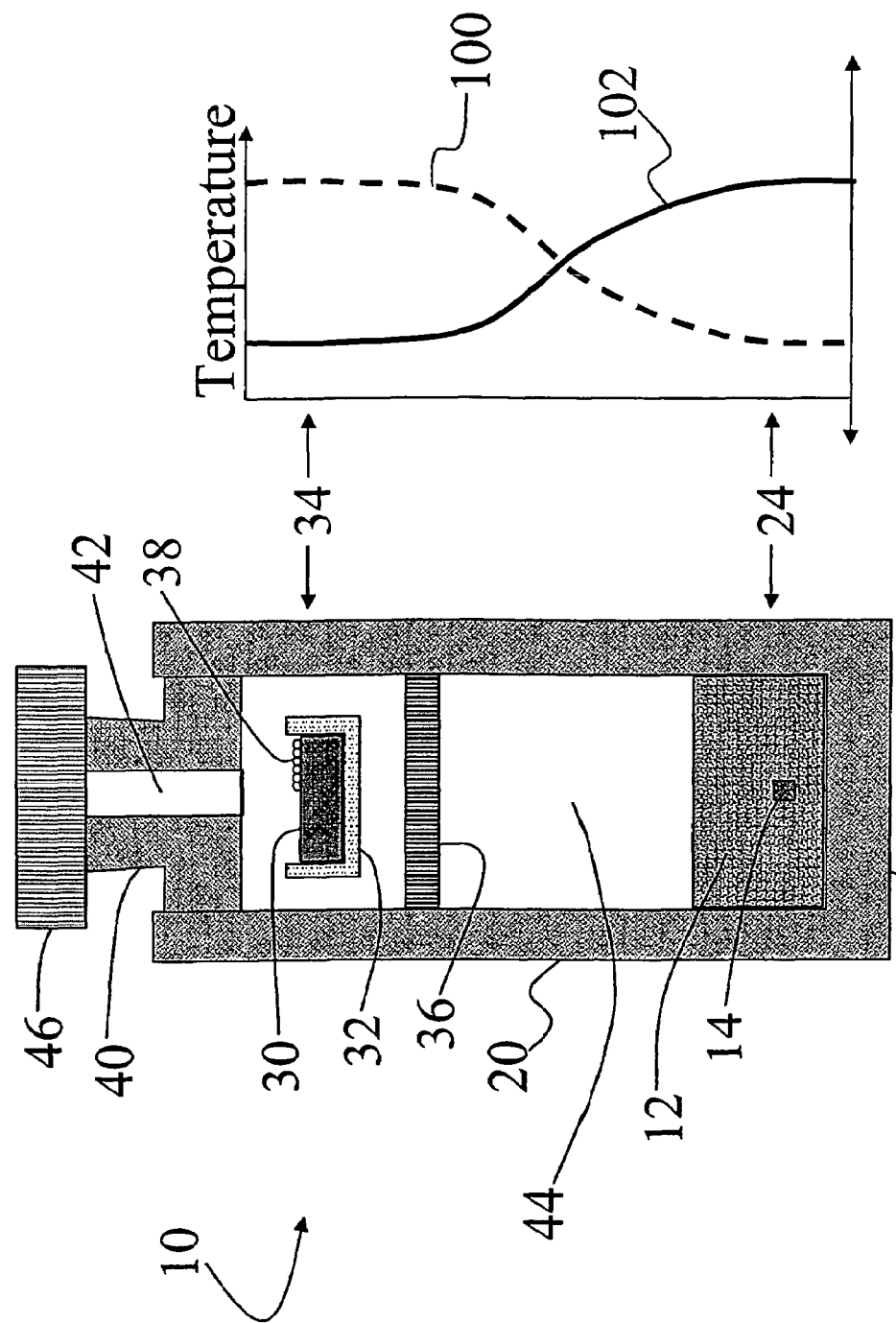
FIG. 1 shows a cross-sectional view of a capsule for use in growing a low dislocation density single crystal gallium nitride substrate boule that may be free of tilt boundaries.

With reference to FIG. 1, a cell or capsule 10 may be used to grow a three-dimensional gallium nitride boule 12 from a gallium nitride seed 14 using a recrystallization technique.

The recrystallization may be performed in a nitrogen-containing superheated fluid. The superheated fluid may be at a determine temperature and/or pressure so as to be supercritical. The capsule 10 may include a main container 20 which may be cylindrical in shape with a diameter of about one inch or larger, although containers having other shapes and sizes may be used. The container 20 may include a sealable bottom section 22, which may be integrally formed with the main container 20, although a separately formed bottom section that may be welded or otherwise secured to the main container may be used.

The container 20 may include the bottom section 22, and may be formed from at least one of copper, gold, silver, palladium, platinum, iridium, ruthenium, rhodium, osmium, titanium, vanadium, chromium, iron, nickel, zirconium, niobium, molybdenum, tantalum, tungsten, rhenium, combinations or two or more thereof, and the like. In one embodiment, the container 20 may include one or more of a copper-based alloy, an iron-based alloy, or a nickel-based alloy. In another embodiment, the container 20 including the bottom section 22 may be formed from a cold-weldable material. Suitable cold-weldable materials may include one or more of copper, gold, silver, palladium, platinum, iridium, ruthenium, rhodium, osmium, iron, nickel, molybdenum, combinations of two or more thereof, and the like. In one embodiment, the cold-weldable material may include an iron-based alloy such as a stainless steel, or a nickel-based alloy (e.g., INCONEL or HASTELLOY). In one embodiment, the container 20 including the bottom section 22 may be made of silver.

The container 20 including the bottom section 22 may be formed of a material that may be sufficiently deformable to allow expansion of the capsule 10 as a pressure inside the capsule 10 increases. The pressure that the capsule 10 may be deformable to, without a breach in the seal, may be a few kbar or higher. The container 20 including the bottom section 22 may be also impermeable to hydrogen, oxygen, and nitrogen.

In one embodiment, the gallium nitride seed 14 may be larger than 0.1 centimeters on a side, may be free of tilt boundaries, and has a relatively low dislocation density of less than about $10^8$ cm$^{-2}$, and more less than about $10^5$ cm$^{-2}$. The gallium nitride seed 14 can be obtained from differing sources. Suitable sources may include heteroepitaxial gallium nitride layers grown on a sapphire or silicon carbide substrate, or from a free-standing gallium nitride film grown by hydride vapor phase epitaxy, sublimation, metalorganic chemical vapor deposition, or the like. If the layer is grown on a sapphire (aluminum oxide) substrate, the substrate may be removed by, for example, etching. Suitable etching methods may include dry etching and wet etching. Alternatively, the gallium nitride seed 14 can be acquired from gallium nitride material previously grown by the recrystallization technique described herein. The gallium nitride seed 14 may be arranged at or near a recrystallization end 24 of the capsule 10. The gallium nitride seed 14 can be secured to an inside surface of the bottom section 22 or to an inside surface of the container 20 by a wire (not shown), or by another fastener.

In one embodiment, the gallium nitride seed crystals may have a dislocation density below $10^4$ cm$^{-2}$ and may be free of tilt boundaries (also known as low-angle grain boundaries), resulting in gallium nitride crystals that similarly have a dislocation density below about $10^4$ cm$^{-2}$ and may be free of tilt boundaries. In another embodiment, the gallium nitride seed crystals contain one or more tilt boundaries. Gallium nitride crystals grown by hydride vapor phase epitaxy may be employed as seed crystals, providing a convenient path to large-area seed crystals. However, GaN crystals grown by HVPE may have a dislocation density in a range of from about $10^5$ to about $10^8$ cm$^{-2}$. In addition, heteroepitaxy produces mosaic structures, and as the thickness of the heteroepitaxial film increases, for example, above 1 millimeter, the presence of tilt boundaries in the thick film becomes increasingly apparent. In the case of a bulk GaN crystal grown according to the superheated fluid-mediated transport methods described herein on a seed with tilt boundaries, the tilt boundaries in the seed crystal may will propagate into the growing crystal.

Source material 30 may be secured by a permeable basket 32 or other fastener at or near a source end 34 of the capsule 10. The source material 30 may be single-crystal, quasi-single crystal, or polycrystalline gallium nitride. In one embodiment, the source material may be amorphous gallium nitride. In one embodiment, the source material may be a gallium nitride precursor such as gallium metal, or a gallium compound, such as an organogallium compound, or the like. The source material 30 may include particles that may be too large to pass through openings of an optional baffle 36 that may separate the source end 34 from the recrystallization end 24. The openings of the baffle 36 may allow passage of gallium nitride precursor material dissolved into a superheated fluid, but do not allow passage of larger solid particles. (If the source material 30 is non-contaminating, or if the capsule 10 is arranged such that direct contamination of the recrystallizing gallium nitride by the source material 30 may be suppressed, then the optional baffle 36 may be suitably omitted.)

A mineralizer 38 may be added to the capsule 10 in order to increase solubility of gallium nitride in the solvent. The mineralizer can be added together with the source material 30, or added separately. Suitable mineralizers may include alkali or alkaline-earth nitrides such as $Li_3N$, $Mg_3N_2$, or $Ca_3N_2$. Other suitable mineralizers may include amides; ammonium salts; halide, sulfide, or nitrate salts; azide salts; or lithium salts. Suitable amides may include $LiNH_2$, $NaNH_2$, or $KNH_2$, urea or related compounds. Suitable ammonium salts may include one or both of $NH_4F$ or $NH_4Cl$. Suitable halide, sulfide, or nitrate salts may include NaCl, $Li_2S$, or $KNO_3$. Suitable azide salts may include $NaN_3$. Suitable lithium salts may include lithium halide. Other suitable mineralizers may include one or more compounds of the aforementioned mineralizers with gallium metal, with gallium nitride, or the like. In one embodiment, the mineralizer 38 may be ammonium fluoride ($NH_4F$). The mineralizer may comprise gallium fluoride, $GaF_3$, or at least one compound produced by chemical reactions between HF, $NH_3$, Ga, and GaN; these will also be referred to as ammonium fluoride mineralizers. Another mineralizer may be ammonium chloride ($NH_4Cl$); however, this mineralizer may be more corrosive than ammonium fluoride, and may be expected to adversely interact with silver, which may be a material for the container 20 of the capsule 10. The mineralizer may comprise gallium chloride, $GaCl_3$, or at least one compound produced by chemical reactions between HCl, $NH_3$, Ga, and GaN; these will also be referred to as ammonium chloride mineralizers.

Optionally, a dopant source (not shown) may be also added to the capsule 10, such as silicon for producing n-type gallium nitride, or magnesium or zinc for producing p-type gallium nitride, or compounds thereof. Added dopants can be used to provide n-type, semi-insulating, p-type, magnetic, or luminescent GaN crystals. Adventitious impurities such as oxygen or carbon will otherwise may render the crystals n-type. N-type dopants such as O, Si, or Ge, or p-type dopants such as Be, Mg or Zn may be suitably added as impurities in the source GaN to produce n-type or p-type doping, respectively. Alternatively, dopants may be added as metals, salts, or inorganic compounds, such as Si, $Si_3N_4$, $SiCl_4$, $BeF_2$, $Mg_3N_2$, $MgF_2$, Zn, $ZnF_2$, or $Zn_3N_2$. GaN crystals with total impurity concentrations in a range of from about $10^{15}$ to about $10^{16}$ centimeters$^{-3}$ may be semi-insulating. The concentration of unintentional impurities may be higher than $10^{16}$ centimeters$^{-3}$ and the crystals may be n-type. Semi-insulating or magnetic GaN crystals may be obtained by doping with certain transition metals such as iron or manganese. Luminescent GaN crystals may be obtained by doping with certain transition or rare-earth metals such as Ti, V, Cr, Mn, Fe, Co, Pr, Eu, Er, or Tm. The transition-metal or rare-earth-metal dopant may be added as impurities in the source GaN or as metals, salts, or inorganic compounds alone or in combination with one or more additional dopants such as O, Si, Mg, Zn, C, or H. Incorporation of B, Al, In, P, or As into the gallium nitride crystal may allow for modification of the band gap.

In one embodiment, in order to keep the concentration of undesired dopants, such as oxygen, to an acceptable level, the impurity levels in the raw materials (source gallium nitride, mineralizer, and solvent) and capsules may be kept limited to appropriately low levels. For example, an oxygen concentration in the grown crystals below $3 \times 10^{18}$ centimeters$^{-3}$ may be achieved by holding the total oxygen content in the raw materials and capsule below about 15 parts per million, expressed with respect to the weight of the final crystal, and an impurity level below $3 \times 10^{17}$ centimeters$^{-3}$ may be achieved by holding the total oxygen content in the raw materials and capsule below about 1.5 parts per million.

With continuing reference to FIG. 1, the source end 34 may be sealed off by a lid 40 that may include an integral fill tube 42. The lid 40 may be suitably made of a material such as one of the materials indicated as being suitable for the container 20, although it will be appreciated that the lid 40 can be made of a different material from the container 20. An airtight seal between the lid 40 and the container 20 may be effected by a pipe thread seal, a metal-to-metal compression fit, a gasket seal, or, more preferably, by welding.

After loading the gallium nitride seed 14, inserting the optional baffle 36, and loading the source material 30 and the mineralizer 38, the lid 40 may be secured into the source end 34 to make an airtight seal, and the fill tube 42 may be connected to a gas manifold (not shown) through which the capsule 10 may be evacuated and back-filled with a suitable mass transport medium 44 such as ammonia, hydrazine, methylamine, ethylenediamine, melamine, or another nitrogen-containing fluid that can be brought to a superheated fluid condition by suitable temperature and pressure control. The backfilled fluid may be in a condensed state during backfilling, and occupies between 25% and 100% of the free volume of the capsule 10. In one embodiment, between 70% and 95% of the free volume of the capsule 10 may be back-filled with ammonia by condensation induced by cooling of the capsule 10 or by injection.

Note that FIG. 1 shows the capsule 10 at a point in time during the recrystallization gallium nitride growth process (described infra). The gallium nitride boule 12 may be shown in FIG. 1 as partially formed, and the mass transport medium 44 may be shown in the superheated fluid state. In the superheated fluid state, the superheated fluid transport medium 44 fully occupies the free volume of the capsule 10.

After evacuation and back-filling, the fill tube 42 of the capsule 10 may be sealed off by a valve cap 46. Rather than employing the valve cap 46, the fill tube 42 can be pinched off to form a weld, or another suitable sealing approach can be employed.

The described capsule 10 may be exemplary only. Other suitable capsules, and methods for filling and sealing such capsules, may be described in D'Evelyn et al., U.S. Published application 20030141301. The reference is incorporated herein by reference.

With continuing reference to FIG. 1 and with further reference to FIG. 2, dissolving of gallium nitride precursor material from the source material 30, mass transport of said dissolved precursor material to the gallium nitride seed 14, and gallium nitride growth by recrystallization at the recrystallization end 24 may be accomplished by controlled application of temperature and pressure in a multiple-heater zone pressure vessel 50 into which the capsule 10 may be loaded. The pressure vessel 50 may include a annular supporting band 52, such as a tungsten carbide die supported by one or more reinforcing steel bands 53, inside of which may be disposed a annular liner 54 of sodium chloride salt or another thermally and electrically insulating material.

A cylindrical heater tube 56 may be disposed inside the annular liner 54. The heater tube 56 may be suitably made of GRAFOIL®, graphite foil, graphite, a NICHROME alloy (such as 60% nickel, 25% iron, and 15% chromium), niobium, titanium, tantalum, stainless steel, nickel, chromium, zirconium, molybdenum, tungsten, rhenium, hafnium, platinum, silicon carbide, combinations of two or more thereof, or the like. Inside the annular liner 54 and the cylindrical heater tube 56 the capsule 10 may be disposed, surrounded by a pressure transmission medium 58 such as sodium chloride salt. Endcaps 60, 62 of steel or another hard electrically conductive material close off ends of the cylindrical volume containing the pressure transmission medium 58 and the capsule 10 and electrically contact ends of the heater tube 56. Upper and lower anvils 63, 64 hold endcaps 60, 62 in fixed position respective to the annular supporting band 52 and the annular liner 54 to define a fixed volume inside of which may be disposed the pressure transmission medium 58 and the capsule 10.

A disk-shaped electrically conductive annulus 66 may be disposed at a selected position intermediate between the endcaps 60, 62, and electrically contacts the cylindrical heater tube 56 and the annular supporting band 52. The conductive annulus 66 may be also formed of one of the materials indicated as being suitable for the heater tube 56. However, it will be appreciated that the heater tube 56 and the conductive annulus 58 may be made of different materials. The endcap 60 may be electrically isolated from the annular supporting band 52 by a annular insulative bushing 70, while the endcap 62 may be electrically isolated from the annular supporting band 52 by an annular insulative bushing 72. The annular insulative bushings 70, 72 may be made of pyrophyllite. In other embodiment, another electrically insulative materials can be employed.

As the annular liner 54 may be electrically insulative, the cylindrical heater tube 56 may be electrically contacted at its ends by the endcaps 60, 62 and at the selected intermediate position by the supporting band 52 via the conductive annulus 58. Otherwise, the heater tube 56 may be electrically isolated. The insulative annular disks 73 provide electrical isolation of the anvils 63, 64 from the annular supporting band 52. Thermally insulative and electrically conductive disks 74 comprising molybdenum foil, graphite, or the like may be disposed inside the annulus of each annular disk 73 to provide electrical contact between top anvil 63 and top endcap 60 and between bottom anvil 64 and bottom endcap 62, respectively.

A two-zone furnace may be thus defined. In the illustrated example, a first heater current flows through a first portion of the heater tube 56 lying between the endcap 60 and the conductive annulus 66. The first heater current may be impressed by a first electrical power source 76 applied between the endcap 60 (via the anvil 63) and the supporting band 52. A second heater current flows through a second portion of the heater tube 56 lying between the conductive annulus 66 and the endcap 62. The second heater current may be impressed by a second electrical power source 78 applied between the supporting band 52 and the endcap 62 (via the anvil 64).

A two-zone furnace controller 80 receives temperature feedback from a first temperature sensor 82 that monitors a temperature near the recrystallization end 24 of the capsule 10 and from a second temperature sensor 84 near the source end 34 of the capsule 10. The temperature sensors 82, 84 may be suitably thermocouple sensors, thermistors, optical fibers coupled to optical pyrometers, or the like. The furnace controller 80 controls the electrical power sources 76, 78 to maintain the ends 24, 34 of the capsule 10 at selected temperature values that effect a selected thermal gradient between the gallium nitride seed 14 and the source material 30.

In operation, the two-zone furnace controller 80 controls the electrical power sources 76, 78 to impress currents on the heater tube 56 that heat the capsule 10 to between about 550 degrees Celsius and 1200 degrees Celsius. The anvils 63, 64, the supporting band 52, the annular liner 54, and the pressure transmission medium 58 of the pressure vessel 50 cooperate to define a fixed volume of the capsule 10 such that as temperatures in the capsule 10 increase the volume of the capsule 10 remains constant, resulting in self-pressurization of the capsule 10 responsive to the heating. The combination of increasing temperature and increasing pressure drives the mass transport medium 44 into a superheated fluid state. The superheated fluid mass transport medium 44 advantageously combines favorable solvent properties that may be typical of liquids with rapid convective mass transport properties that may be typical of gases. The gallium nitride dissolving properties of the superheated fluid 44 may be enhanced by the mineralizer 38. Mass transport of gallium nitride precursors from the source material 30 to the gallium nitride seed 14, or to the growing gallium nitride boule 12, may be enhanced by formation of chemical complexes combining the mineralizer 38 with metal nitride precursors. The term boule may include both boules and ingots.

Depending upon the concentration of the mineralizer 38 dissolved into the superheated fluid solvent 44, under crystal growth conditions, the superheated fluid solution can be supercritical or subcritical. For example, ammonia has a critical temperature and pressure of 132 degrees Celsius and 113 bar, respectively. The corresponding quantities for $NH_4F$ may be similar to the values for $NH_4Cl$, which may be about 882 degrees Celsius and about 1635 bar. A solution of $NH_4F$ in ammonia may have a critical point at a temperature and pressure intermediate between the critical temperatures and pressures of the constituents $NH_4F$ and ammonia. The presence of gallium-containing complexes in the solution may affect or modify the equation of state and critical point of the superheated fluid.

The two-zone furnace controller 80 may control temperatures at the recrystallization end 24 and the source end 34 of the capsule 10. This control may create a selected or determined temperature gradient therebetween. Moreover, by selecting the fixed volume defined by relative positioning of the anvils 63, 64 and the supporting band 52 of the pressure vessel 50 and further defined by the amount of mass transport medium 44 back-filled into the capsule 10 (measured, for example, as the percentage of the free volume occupied by the mass transport medium 44 in the condensed state) the pressure inside the capsule 10 at elevated temperature can be selected. Pressure inside the capsule 10 may be indirectly monitored by measuring a press force of the anvils 63, 64, by a stroke gauge monitoring motion of the anvils 63, 64, or by another suitable measure.

In one embodiment, the pressure vessel may be the same as, or similar to, the pressure vessel described in D'Evelyn et al., U.S. Published Application 20030140845, which is hereby incorporated by reference.

To affect recrystallization growth of gallium nitride on the gallium nitride seed 14, the source end 34 and the recrystallization end 24 may be set to temperatures that cause a temperature gradient across the capsule 10 which results in dissolution of the source material 30 and growth at the recrystallization end 24. Thus, precursor mass transport occurs from the source end 34 to the recrystallization end 24 where it contributes to recrystallization crystal growth of the gallium nitride boule 12.

It has been found that preceding the recrystallization crystal growth by a preparatory stage may be useful for achieving low dislocation densities. Low dislocation densities may be less than about $10^4$ $cm^{-2}$. In one embodiment, the dislocation density may be in a range of from about $10^4$ $cm^{-2}$ to about $10^3$ $cm^{-2}$, from about $10^3$ $cm^{-2}$ to about 100 $cm^{-2}$, or less than about 100 $cm^{-2}$. During the preparatory stage, the rate of deposition on the gallium nitride seed 14 may be lower than during the subsequent gallium nitride recrystallization growth stage. In one embodiment, the preparatory stage may include an etching stage in which the recrystallization end 24 and the source end 34 may be set to temperatures that produce a temperature gradient that may be opposite the temperature gradient during crystal growth. This reversed temperature gradient causes dissolution or etching of the gallium nitride seed 14. The etching stage may produce a cleaner, more defect-free prepared surface of the gallium nitride seed 14, which may lead to lower dislocation densities in the gallium nitride boule 12 formed during gallium nitride recrystallization.

With reference to FIGS. 1 and 2, during the preparatory stage the two-zone furnace controller 80 controls the electrical power sources 76, 78 to produce a preparatory temperature profile 100 diagrammatically shown in FIG. 1, in which the recrystallization end 24 may be at a lower temperature relative to the source end 34, so that a temperature gradient exists therebetween. For the exemplary two-zone heater arrangement of FIG. 2, the temperature profile 100 may be suitably achieved by applying relatively more power using the first electrical power supply 76 and relatively less power using the second electrical power supply 78. The temperature gradient of the temperature profile 100 effects etching of the gallium nitride seed 14 in the presence of ammonium fluoride ($NH_4F$) mineralizer 38 to prepare the surface.

After the preparatory stage may be completed, the furnace controller 80 adjusts the electrical power sources 76, 78 to produce a gallium nitride growth temperature profile 102 also diagrammatically shown in FIG. 1, in which the source end 34 may be at a lower temperature relative to the recrystallization end 24 such that an opposite temperature gradient exists for the nitride growth temperature profile 102 as compared with the etching temperature profile 100. For the exemplary two-zone heater arrangement of FIG. 2, the temperature profile 102 may be achieved by applying relatively less power using the first electrical power supply 76 and relatively more power using the second electrical power supply 78. The temperature gradient of the temperature profile 102 may affect recrystallization growth on the gallium nitride seed 14 in the presence of ammonium fluoride ($NH_4F$) mineralizer 38 to produce the gallium nitride boule 12.

The thermal gradient directions of the temperature profiles 100, 102 may be suitable for use with an ammonium fluoride ($NH_4F$) mineralizer. Fluorine-containing complexes may provide mass transport of gallium nitride precursors in the superheated fluid mass transport medium 44, and that these fluorine-containing complexes decompose more efficiently at higher temperatures such that recrystallization growth may be promoted at the high temperature end of the temperature gradient. Formation of the complexes may be reversible, with an equilibrium constant for formation that decreases with temperature so that formation of free GaN may be favored at higher temperature and the effective solubility of GaN decreases with temperature. After ending a crystal growth run using the $NH_4F/NH_3$ chemistry, the capsule may fill with white needle-shaped crystals. X-ray diffraction analysis indicates that the crystals comprise $GaF_3(NH_3)_2$ and $(NH_4)_3GaF_6$.

For some other mineralizers, such as ammonium chloride ($NH_4Cl$), this effect may be reversed. Recrystallization growth occurs in the presence of ammonium chloride at the lower temperature end of the temperature gradient. For such chemistries, the thermal gradients of the temperature profiles 100, 102 may be suitably reversed or otherwise adjusted.

The pressure vessel 50 with integral two-zone furnace shown in FIG. 2 may be exemplary only. The pressure vessel 50 may be configured based on particular end-results. For example, additional electrically conductive elements similar to the electrically conductive annulus 66 can be disposed in spaced apart fashion between the endcaps 60, 62, with additional electrical power sources similar to the power sources 76, 78 coupled thereto to define a three-zone or higher-zone furnace. Moreover, wires or other electrically conductive elements can be substituted for the illustrated electrically conductive annulus 66. With other minor adaptations, the exemplary pressure vessel 50 with integral two-zone furnace can be adapted to a belt apparatus, a piston-cylinder apparatus, a multi-anvil apparatus, a split-sphere apparatus, or other pressure vessel apparatus known in the art.

Figure 4:
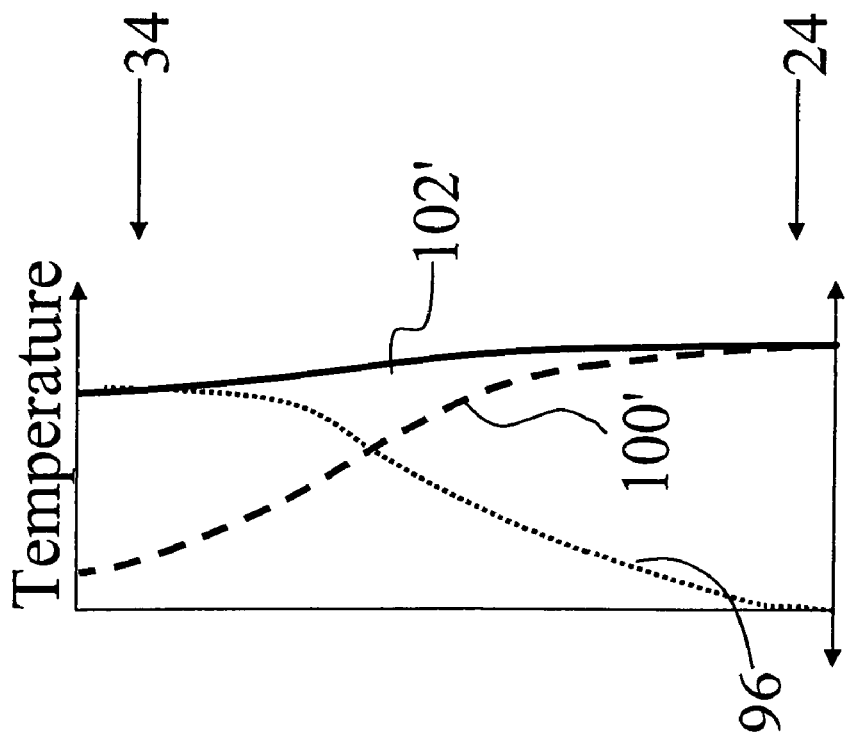
FIG. 4 shows temperature profiles during the preparatory and recrystallization crystal growth phases of the boule formation process when using the alternative furnace configuration of FIG. 3.
Figure 3:
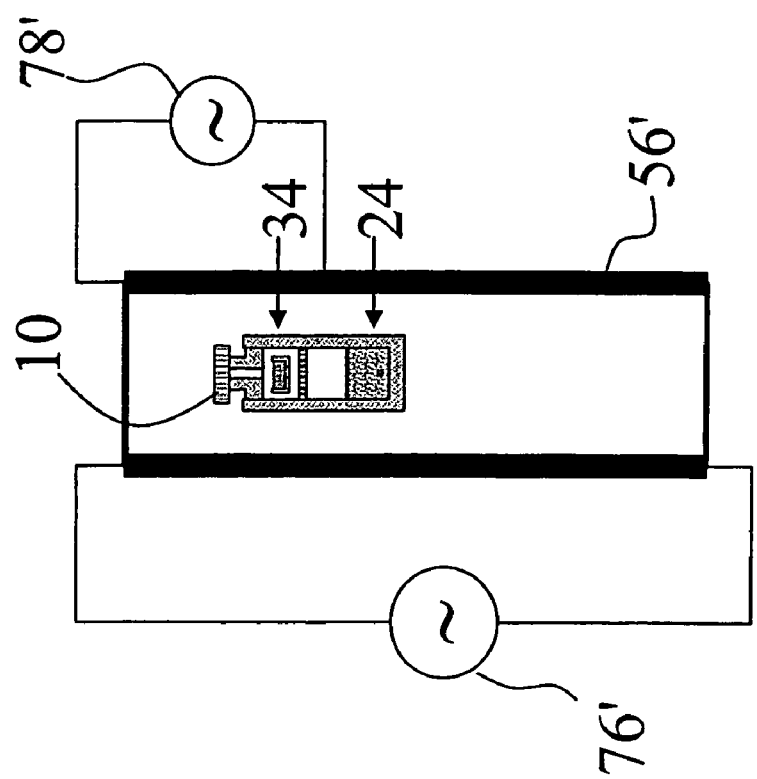
FIG. 3 shows an alternative configuration of the two-zone furnace of the pressure vessel of FIG. 2.

In another variation described with reference to FIGS. 3 and 4, a cylindrical heater tube 56' has the capsule 10 may be arranged near an upper end of the heater tube 56', that is, within a temperature gradient zone near an upper end of the heater tube 56'. An electrical power source 76' may be applied across the length of the heater tube 56', for example by applying the electrical power source 76' across the anvils 63, 64. Thus, for example, a temperature profile 100' may be obtained by applying power using the electrical power supply 76' without applying power using a second electrical power source 78' that heats an upper end of the heater tube 56'. To raise temperature at the source end 34 to reduce or reverse the temperature gradient, power may be applied by the electrical power source 78' to produce a temperature profile contribution 96 that provides additional heat at the source end 34. The temperature profile 102' may be the sum of the temperature profile contributions 96, 100'.

To obtain low dislocation density gallium nitride, a low dislocation density seed crystal 14 may be used. Gallium nitride crystals with a dislocation density below about $10^4$ $cm^{-2}$ that may be free from tilt boundaries may be grown from a seed crystal with tilt boundaries and with a dislocation density in a range of from about $10^5$ to about $10^8$ $cm^{-2}$ using the superheated fluid-mediated growth method as follows.

Figure 5A:
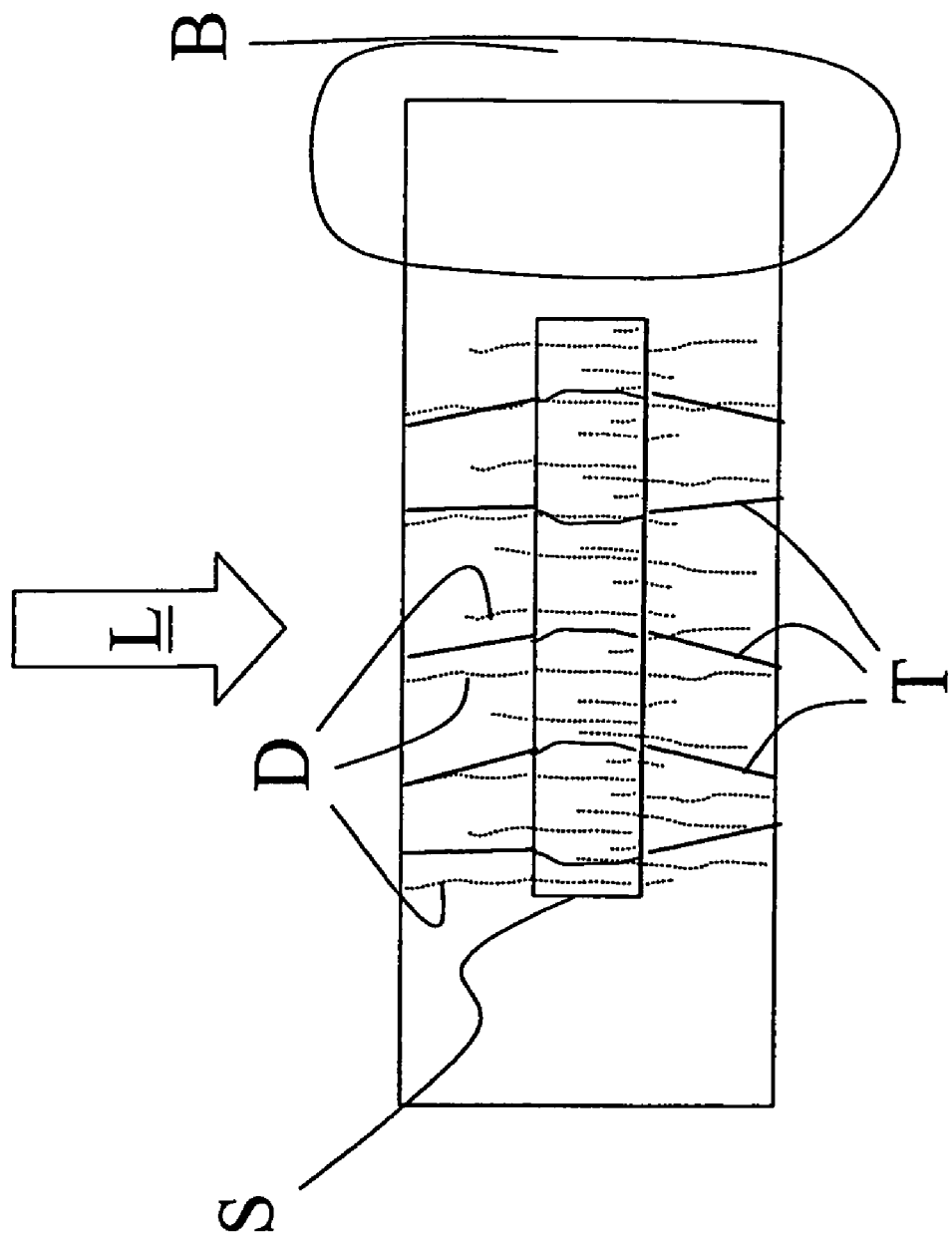
FIG. 5A diagrammatically shows a low defect density seed crystal on which bulk GaN has been grown.

With reference to FIGS. 5A and 5B, by suitable control of the solvent fill, mineralizer concentration, temperature, and temperature gradient, growth on the seed will degrees occur in both the c-direction (that is, (0001) and (000$\bar{1}$), along the c-axis) and perpendicular to the c-direction (for example, in the (1$\bar{1}$00) and (11$\bar{2}$0) directions). FIGS. 5A and 5B illustrate growth of GaN material on a seed S. In the diagrammatic view of FIG. 5A, the orientation of the (0001) and (000$\bar{1}$) directions may be shown. FIG. 5B diagrammatically illustrates the same crystal with growth of GaN thereon but viewed along the direction L indicated in FIG. 5A. In FIG. 5A, dislocations D may be diagrammatically indicated by dotted lines, while tilt boundaries T may be diagrammatically indicated by solid lines. Additional dislocations associated with the tilt boundaries may be omitted for clarity. In FIG. 5B the dislocations, which may be oriented along the (0001) direction, may be omitted.

The dislocation density in bulk GaN grown in the c-direction may be reduced significantly. For example, starting with the exemplary rectangular seed S having a dislocation density of about $10^7$ $cm^{-2}$, growth of a 300-800 μm thick layer above the c-oriented seed crystal S results in bulk GaN material with approximately $1-3 \times 10^6$ dislocations $cm^{-2}$ in the region above the seed in the (0001) direction. However, exemplary bulk GaN region B grown laterally with respect to a c-oriented seed crystal has fewer than $10^4$ dislocations $cm^{-2}$, fewer than $10^3$ dislocations $cm^{-2}$, and even more fewer than 100 dislocations $cm^{-2}$. Because dislocations may be predominantly (0001) oriented, they do not propagate into the laterally grown material such as into the bulk GaN region B.

Similarly, tilt boundaries T present in the c-oriented seed crystal S will propagate during growth in the c direction, resulting in a grain structure in bulk GaN grown above the seed S that may be similar to that in the seed. Tilt boundaries will also radiate outwardly into the bulk GaN that may be grown laterally, resulting in progressively larger domains in the bulk GaN region that may be free of tilt boundaries as the crystal becomes larger. For example, the GaN region B may be free of tilt boundaries. The position of the tilt boundaries may be determined by a method that may be well known in the art, such as x-ray diffraction, x-ray topography, cathodoluminescence, or optical reflection, and a new seed crystal may be cut from the laterally-grown GaN region B that may be entirely free of tilt boundaries. Bulk GaN grown from this new seed crystal cut from the region B may be free of tilt boundaries and may have a dislocation density below $10^4$ $cm^{-2}$. In one embodiment, the dislocation density may be in a range of from about $10^4$ $cm^{-2}$ to about $10^3$ $cm^{-2}$, or less than about 100 $cm^{-2}$.

In one superheated fluid-mediated recrystallization gallium nitride growth run example, an ammonium fluoride mineralizer is used with a gallium nitride seed weighing 25.3 milligrams. The seed is obtained from a previous superheated fluid-mediated recrystallization gallium nitride growth run. The seed is hung through a laser-drilled hole by a 0.13 millimeter silver wire from a silver baffle with a 35 percent open area and is placed in the recrystallization end of a 0.5 inch diameter capsule container. A 0.10 grams amount of ammonium fluoride ($NH_4F$) mineralizer and 0.98 grams of polycrystalline gallium nitride source material is placed in the source end of the capsule. The capsule is then enclosed within a filler/sealing assembly together with a 0.583 inch diameter steel ring. The capsule and filler/sealing assembly are transferred to a gas manifold and filled with 1.07 grams of ammonia. Next, the plug is inserted into the open top end of the capsule, such that a cold weld forms between the silver capsule and silver plug and the steel ring surrounds the plug and provides reinforcement. The capsule is removed from the filler/sealing assembly and inserted in a pressure vessel with integral two-zone furnace that is mechanically similar to the pressure vessel 50 of FIG. 2, and electrically similar to the configuration of the two-zone furnace shown in FIG. 3.

The capsule is heated using the primary heater 76' at about 11° C./min until the temperature of the recrystallization end 24 of the capsule 10 is approximately 700 degrees Celsius and the temperature of the source end 34 of the capsule 10 is approximately 648 degrees Celsius, as measured by type K thermocouples. The current through the source end 34 increases using the heater 78' until the temperature gradient $\Delta T$ decreases to 3 degrees Celsius. After holding at $\Delta T=3°$ C. for 1 hour, the temperature of the source end of the capsule is decreased at 5° C./hr by reducing power applied by the heater 78' until $\Delta T$ increases to approximately 30 degrees Celsius, then is decreased at 2.5° C./hr until $\Delta T$ increases to approximately 60 degrees Celsius and the temperatures are held at these values for 20 hours.

The cell cools and is removed from the pressure vessel. Upon opening the capsule after venting of the ammonia, the gallium nitride seed has grown to a weight of 40.2 mg. An etch pit density measurement of dislocation density is performed by etching the crystal in 50% $HNO_3$ for 30 min. A row of etch pits is observed on the c-face above the interface between the seed and new, laterally-grown material. However, the remaining areas of newly-grown GaN are free of etch pits. The area of pit-free newly grown GaN is approximately 0.069 centimeters$^2$, indicating that the etch pit density is less than (1/0.069 centimeters$^2$) or 14 cm$^{-2}$.

The described gallium nitride growth run may be exemplary only. Other examples of gallium nitride growth runs may be described in D'Evelyn et al., U.S. patent application Ser. No. 10/329,981. The gallium nitride grown by recrystallization including the preparatory etch process and characterized by etch pit density measurements may be may free of etch pits except for a small area formed over the gallium nitride seed and aligned with a c-axis of the gallium nitride seed. These etch pit free areas may correspond to an upper limit on dislocation density of less than 50 cm$^{-1}$. Similarly low dislocation density values have been determined using cathodoluminescence characterization of the dislocation densities.

Gallium nitride substrates having lateral dimensions of at least about 1.5 centimeters by 1.8 centimeters have been produced by the disclosed GaN recrystallization growth method, and the described methods and apparatuses may be readily scalable to larger sizes. Wafers having a minimum lateral dimension of 25 millimeters may be produced that are large enough to produce most resonant cavity light emitting devices or arrays of such devices.

While a embodiment employs an etch preparatory period followed by recrystallization growth, it may be used to use more complex preparatory periods, such as a cycling between etching and growth two or more times to provide further surface improvement and dissolution of spontaneously-nucleated crystals. That under selected temperature and pressure conditions the preparatory period can be designed to etch gallium nitride has been verified by loading a thin gallium nitride film deposited on sapphire in place of the gallium nitride seed 14. The thin gallium nitride film may be etched away. A gradual transition from the etching condition to the recrystallization growth condition may be also believed to be beneficial in producing low dislocation densities. The gradual transition effects a slow initial recrystallization growth rate that provides additional surface smoothing, surface step restructuring, or the like. Moreover, while preparatory periods that include etching followed by a gradual transition through a slow growth rate have been employed, it may be useful to employ a preparatory period that may include a slow initial recrystallization growth rate without an initial etching period, thus relying upon surface smoothing provided by the slow growth rate to improve GaN crystal quality.

Crystal growth recipes specifying specific temperature setpoints, preparatory process time intervals, and the like, may be apparatus-specific. For example, the readings of the temperature sensors 82, 84 used for control may be indicative of the actual temperatures at the recrystallization and source ends 24, 34 of the capsule 10, but may be may not exact. Temperature differences between the readings of the sensors 82, 84 and the actual temperatures in the capsule 10 can arise due to spatial separation of the sensors 82, 84 from the capsule 10, miscalibration of the sensors 82, 84, emissivity errors in the case of pyrometric temperature sensors, and so forth.

In a growth run, for example, the type K thermocouples may indicate a positive temperature gradient directed from the source material to the gallium nitride seed during the preparatory stage, but a reversed thermal gradient may be present within the capsule 10 during at least a portion of the preparatory stage. Alternatively, or in combination, a slow growth rate effected by a small positive temperature gradient directed from the source material to the gallium nitride seed during the preparatory stage may be responsible for the observed low dislocation density.

The transition from the preparatory temperature profile to the gallium nitride growth temperature profile may be performed gradually as described in the exemplary growth run, in which the temperature of the source end 34 may be gradually increased. The detailed temperature transients introduced during this temperature profile change may be also may apparatus-specific.

The gallium nitride boule 12 may exhibit a concentration of hydrogen. For example, a gallium nitride single crystal formed by the superheated fluid-mediated recrystallization growth process was characterized by infrared transmission spectroscopy and by Raman spectroscopy. In contrast to gallium nitride grown by other methods such as hydride vapor phase epitaxy, the gallium nitride grown by the superheated fluid-mediated recrystallization growth process had several sharp absorption peaks in a range of from about 3050 cm$^{-1}$ to about 3300 cm$^{-1}$, with a maximum absorption near 3175 centimeters$^{-1}$. The crystal may be annealed to 750 degrees Celsius in high purity nitrogen for 30 min and the infrared spectrum re-measured. The absorption peaks in a range of from about 3050 centimeters$^{-1}$ to 3300 centimeters$^{-1}$ were unchanged, indicating a high stability of these species. The absorption peaks in a range of from about 3050 centimeters$^{-1}$ to about 3300 centimeters$^{-1}$ may be associated with hydrogen complexed with gallium vacancies. In n-type gallium nitride, gallium vacancies act as deep, triple acceptors that compensate donors. Hydrogen can bind to gallium vacancies, capping the dangling bond on between one and four surrounding nitrogen atoms to form N—H bonds, denoted $V_{Ga}H$, $V_{Ga}H_2$, $V_{Ga}H_3$, and $V_{Ga}H_4$, respectively. N—H bonds associated with Ga vacancies may have [C. Van de Walle, Phys. Rev. B 56, R10020 (1997)] vibration frequencies between 3100 centimeters$^{-1}$ and 3500 centimeters$^{-1}$ and may be stable.

Based on predictions of vibrational frequencies of 3100-3470 centimeters$^{-1}$ for $V_{Ga}H_1$-$V_{Ga}H_4$ (which may overestimate the actual frequencies by about 200 centimeters$^{-1}$) and the observation of infrared absorption features at 3020-3050 centimeters$^{-1}$ and at 3140 centimeters$^{-1}$ in hydrogen-implanted gallium nitride [M. G. Weinstein et al., Appl. Phys. Lett. 72, 1703 (1998)], absorption peaks between 3150 and 3200 centimeters$^{-1}$ that may be observed in the superheated fluid-mediated recrystallization grown gallium nitride may correspond to $V_{Ga}H_3$ and $V_{Ga}H_4$. The absorption peaks between 3000 and 3150 centimeters$^{-1}$ observed in both superheated fluid-mediated recrystallization grown gallium nitride and hydrogen-implanted gallium nitride may be believed to correspond to $V_{Ga}H_1$ and $V_{Ga}H_2$.

Thus, the presence of an infrared absorption feature near 3175 centimeters$^{-1}$ in gallium nitride crystals grown by the superheated fluid-mediated recrystallization method indicates hydrogen passivation of gallium vacancies, and the persistence of the infrared feature upon high temperature annealing indicates that this passivation may be relatively stable. Depending on the concentration of hydrogenated gallium vacancies in the GaN crystal, the absorbance per unit thickness of the 3175 centimeters$^{-1}$ peak will lie between about 0.01 centimeters-1 and 200 centimeters$^{-1}$. Additional evidence for the passivation of point defects in a gallium nitride crystal grown by the superheated fluid-mediated recrystallization growth method was obtained by Raman spectroscopy. A total of five peaks were observed in two configurations between 400 and 800 centimeters$^{-1}$. The peaks, with the assignments in brackets, were observed at 530 centimeters$^{-1}$ [$A_1$(TO)], 558 centimeters$^{-1}$ [$E_1$(TO)], 569 centimeters$^{-1}$ [$E_2$ (high)], 734 centimeters$^{-1}$ [$A_1$(LO)], and 742 centimeters$^{-1}$ [$E_1$(LO)]. These values may be all within a few centimeters$^{-1}$ of accepted values for pure gallium nitride reported in the literature. A broad peak associated with phonon-plasmon coupling was not observed. The observation of unshifted LO modes and the absence of a phonon-plasmon mode indicates a carrier concentration below $10^{17}$ centimeters$^{-3}$, based on Raman measurements reported in the literature on gallium nitride with carrier concentrations between $10^{16}$ centimeters$^{-3}$ and $10^{20}$ centimeters$^{-3}$. The total impurity concentration in this crystal was above $10^{19}$ centimeters$^{-3}$. The drastic reduction in carrier concentration relative to the impurity concentration indicates a high degree of compensation, most likely due to hydrogen.

Within the visible spectrum, the gallium nitride boule 12 may exhibit substantial transparency. The optical absorption coefficient for nominally undoped crystals may be less than 5 centimeters$^{-1}$ between 465 nanometers and 700 nm. Doped crystals exhibit similarly low absorption, although some free carrier absorption may be introduced at high carrier concentrations. Moreover, dopants, substitutional or interstitial impurities, vacancy complexes, or other point defects may introduce narrow peaks of higher absorption within the visible range. Such point defect-related narrow absorption peaks may do not, however, significantly reduce the substantial transparency of the crystal in the visible for purposes such as backside extraction of illumination or other useful light output generated by the resonant cavity light emitting device.

The incorporated hydrogen may be believed to be benign or possibly even beneficial. Typical gallium nitride crystal growth methods do not provide passivation of gallium vacancies by hydrogenation, even if hydrogen may be in the growth system. For example, infrared transmission spectroscopy on 300-400 μm thick GaN samples grown by hydride vapor phase epitaxy (HVPE) revealed weak absorption features near 2850 and 2915 centimeters$^{-1}$ associated with another defect, but no absorption features between 3100 and 3500 centimeters$^{-1}$ that could be assigned to hydrogenated Ga vacancies were observed in the HVPE gallium nitride material.

A gallium nitride boule 12 may be grown using at least one of $NH_4F$, $GaF_3$, or other compounds obtainable by reaction of Ga, GaN, $NH_3$, and HF, as mineralizer. In one embodiment, the gallium nitride may contain greater than about 0.02 ppm fluorine. In one embodiment, gallium nitride may contain an amount of fluorine in a range of from about 0.02 ppm and about 0.04 ppm, or from about 0.04 ppm to about 1 ppm. The incorporated fluorine may be quantified by, for example, one or more of glow discharge mass spectrometry, secondary ion mass spectrometry, fusion-dissolution followed by inductively-coupled plasma, or fluorine-selective-electrode analysis, or the like. Bond lengths to fluorine in molecules or solids may be only slightly larger than the corresponding bonds to hydrogen, so that fluorine may play a similar role in passivating defects.

Figure 6A:
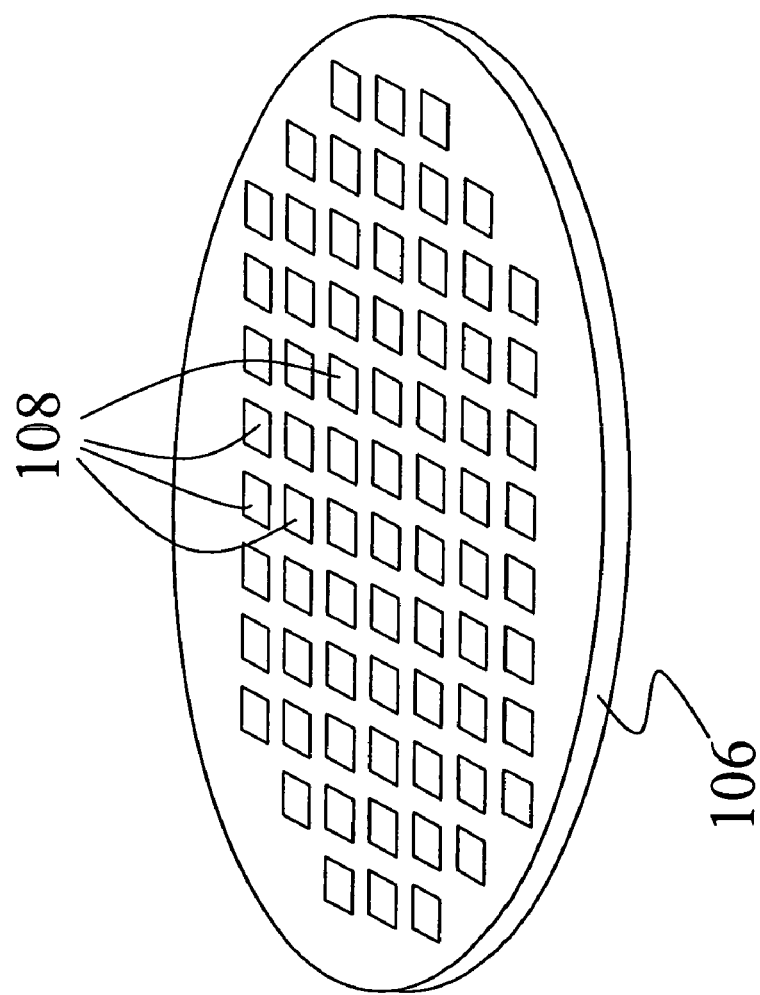
FIG. 6A shows an example gallium nitride wafer sliced from the gallium nitride boule of FIG. 6 with an array of resonant cavity light emitting devices formed thereon.
Figure 6:
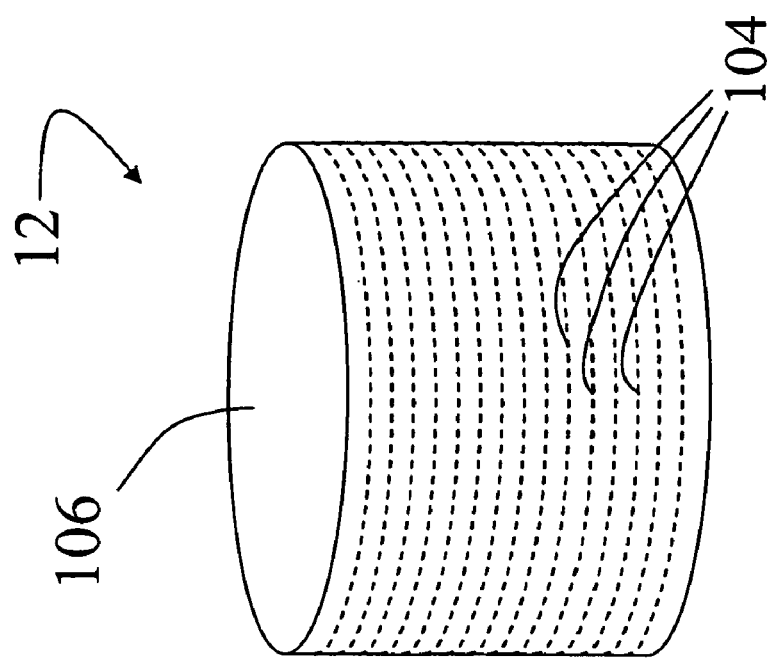
FIG. 6 shows the low dislocation density single crystal gallium nitride boule extracted from the capsule of FIG. 1.

With reference to FIGS. 6 and 6A, the superheated fluid-mediated recrystallization grown gallium nitride boule 12 may be sliced (as indicated in FIG. 6 by dashed slice cut lines 104) to produce a plurality of gallium nitride wafers, such as exemplary gallium nitride wafer 106. Each wafer 106 may have a diameter of at least 0.1 centimeters. In one embodiment, the diameter may be in a range between 2.5 centimeters and 5.0 centimeters. Larger diameter wafers may be used. Moreover, while a round wafer 106 may be shown, otherwise-shaped wafers can also be used.

A selected wafer, such as the wafer 106, may be used for epitaxial growth of a stack of group III-nitride layers including a first mirror sub-stack and an active region adapted for fabrication into one or more resonant cavity light emitting devices. Semiconductor device fabrication processing may be applied to the stack of group III-nitride layers to define a plurality of devices, such as the exemplary resonant cavity light emitting devices 108 shown in FIG. 6A on the gallium nitride wafer 106. The gallium nitride substrate wafer 106 including portions that extend between the devices 108 do not include tilt boundaries or edge dislocation arrays associated with tilt boundaries. Moreover, the semiconductor layers of the devices 108 may be epitaxially grown and mimic the substrate, and thus also have no tilt boundaries and may have dislocation densities comparable to the dislocation density of the substrate 106. For illumination applications, the devices 108 may be relatively large-area devices, for example, devices that may be at least 0.05 centimeters on a side corresponding to device areas of order thousands or tens of thousands of square micrometers.

The gallium nitride boule 12 may be sliced to provide a selected crystal surface for epitaxial growth of the stack of group III-nitride layers. In differing embodiments, the epitaxy surface orientation may be selected from a group consisting of: (0001), (000<u>1</u>), (1<u>1</u>00), and (11<u>2</u>0), where the underscore indicates a negative value (also indicated in conventional crystal orientation notation using an overbar). It will be appreciated that the (0001) and (000<u>1</u>) orientations may be available on opposite sides of a wafer sliced with the principal surface perpendicular to the [0001] crystal direction. The (0001) surface orientation may be may provided by epitaxial lateral overgrowth and related techniques; however, this surface may be a polar surface, which can lead to polarization fields at interfaces of group III-nitride layers. In contrast, the (1<u>1</u>00) surface and the (11<u>2</u>0) surface may be non-polar surfaces that suppress polarization fields at layer interfaces. In one embodiment, a non-polar surface may be co-planar with the a-plane.

Prior to epitaxial deposition, the gallium nitride substrate wafer 106 may be mechanically polished to a mirror finish. Subsurface damage on the wafer left over from the polishing process may be suitably removed by one or more techniques such as chemically-assisted ion beam etching, reactive ion etching, high ion density plasma etching, wet etching, chemo-mechanical polishing, or the like. Residual damage may be optionally also removed by heating the wafer 106 to a temperature between 700 degrees Celsius and 1500 degrees Celsius in an atmosphere containing ammonia, and at a partial pressure in a range of greater than about 0.1 bar. In one embodiment, the partial pressure is greater than about 5 kbar, in a range of from about 5 kbar to about 10 kbar, from about 10 kbar to about 15 kbar, from about 15 kbar to about 20 kbar, or greater than about 20 kbar.

The stack of group III-nitride layers may be deposited by an epitaxial method such as metalorganic chemical vapor deposition (also known in the art by similar nomenclatures such as organometallic vapor phase epitaxy) or by molecular beam epitaxy. Group III-nitride materials for optoelectronic devices may include binary compounds GaN, AlN, InN, ternary compounds $In_xGa_{1-x}N$, $Al_xGa_{1-x}N$, $In_xAl_{1-x}N$, and quaternary compounds $In_xAl_yGa_{1-x-y}N$ where the indices x and y may be in a range between 0 and 1 and for the quaternary alloys the sum (x+y) may be in a range between zero and one. The group III element boron can also be incorporated into some of the group III-nitride layers. It may be useful to incorporate a small fraction of another group V element besides nitrogen into selected layers, such as phosphorous or arsenic.

Prior to growing the stack of group III-nitride layers, the gallium nitride wafer 106 may be prepared in the reactor (for metalorganic chemical vapor deposition) or growth chamber (for molecular beam epitaxy) by heating the wafer 106 to about 900 degrees Celsius to 1200 degrees Celsius in an atmosphere containing ammonia. The partial pressure may be in a range of from about $10^{-6}$ mbar to about 1 bar. Group III precursors for metalorganic chemical vapor deposition include trimethyl gallium, trimethyl aluminum, and trimethyl indium; however, other group III precursors such as triethyl gallium can be employed. For molecular beam epitaxy, elemental gallium, aluminum, and indium may be suitably used as group III sources. Optionally, in a gas-source molecular beam epitaxy system, organometallics may be employed as the group III sources similarly to in metalorganic chemical vapor deposition. Ammonia may be used as the nitrogen source, although other nitrogen sources such as hydrazine, a methyl hydrazine compound, or the like can be employed. For molecular beam epitaxy, a cracker can be used to promote dissociation of the nitrogen precursor, or an atomic nitrogen source can be employed. Dopant sources for metalorganic chemical vapor deposition include silane, disilane, or the like for n-type doping, and bis-(cyclopentadienyl)magnesium, dimethylzinc, or the like for p-type doping. Elemental dopants can be used in molecular beam epitaxy.

Hydrogen may be a common impurity in group III-nitride materials, and in the case of a p-type material hydrogen-acceptor complexes can cause high resistivity of the p-type material. Preferably, hydrogen-acceptor complexes may be dissociated by annealing at a temperature above 400 degrees Celsius, or hydrogen incorporation can be suppressed by performing the epitaxy in a hydrogen-free environment. In the absence of hydrogen, p-type resistivities may be below about $10^5$ ohm-cm.

Because the stack of group III-nitride layers may be lattice matched to the gallium nitride substrate 106, the group III-nitride layers may have dislocation densities comparable to that of the gallium nitride substrate 106. Thus, for example, the gallium nitride substrate 106 has a dislocation density of less than $10^4$ cm$^{-2}$, and more has a dislocation density of less than $10^3$ cm$^{-2}$, and still more has a dislocation density of less than 100 cm$^{-2}$; the stack of group III-nitride layers correspondingly has a dislocation density of less than 1 cm$^{-2}$, and more has a dislocation density of less than $10^3$ cm$^{-2}$, and still more has a dislocation density of less than 100 cm$^{-2}$. Somewhat higher dislocation densities may occur in layers containing In and/or Al due to the small lattice mismatch, or in layers grown on top of layers containing In and/or Al due to propagation of dislocations from the In- and/or Al-containing layers. Moreover, the stack of group III-nitride layers has a principal surface with an orientation corresponding to epitaxy surface orientation of the substrate, which may be selected from a group consisting of: (0001), (000$\underline{1}$), (1$\underline{1}$00), and (11$\underline{2}$0), or within 10 degrees of these orientations.

Figure 7:
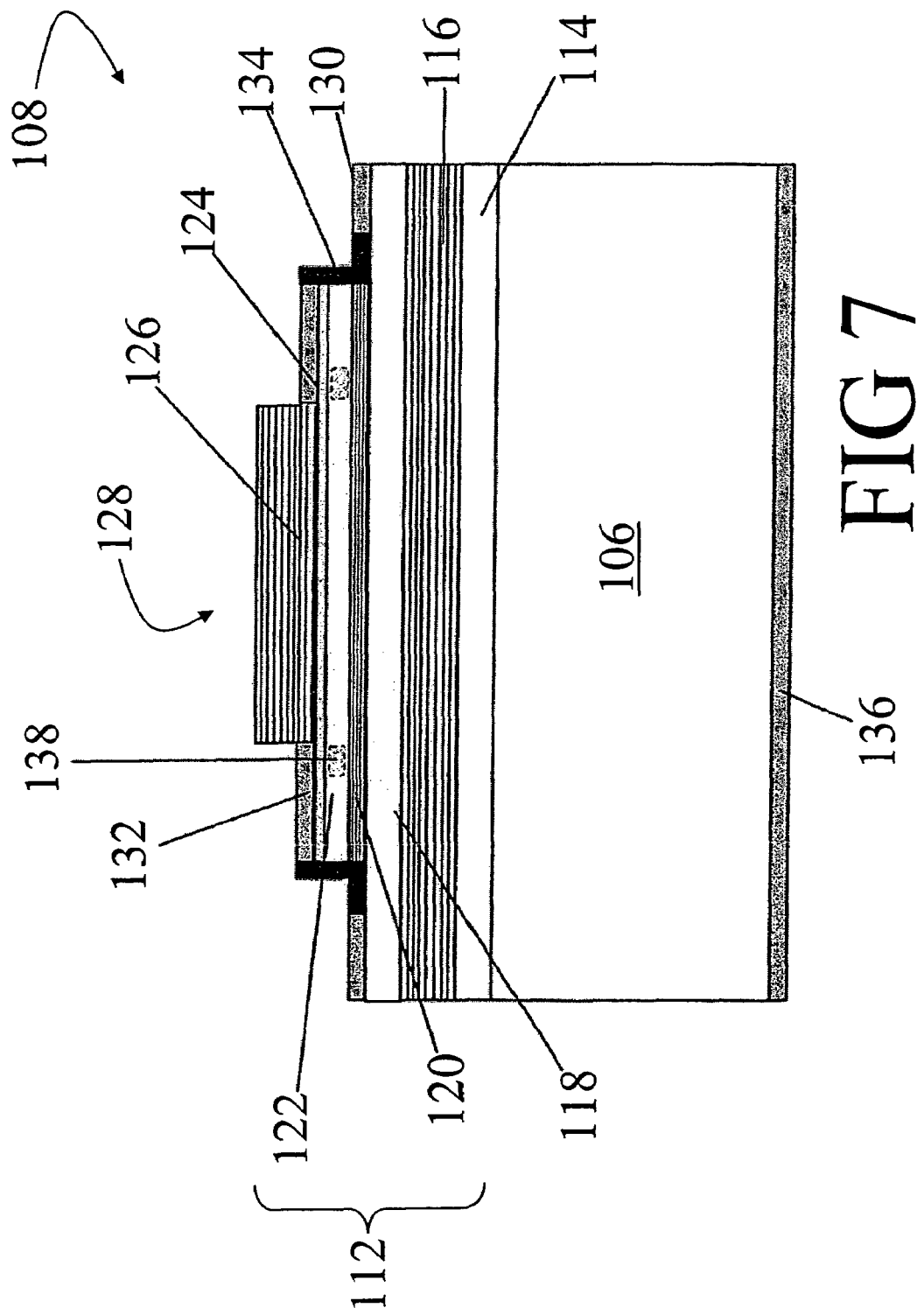
FIG. 7 shows an example resonant cavity light emitting device layer structure suitable for use as a resonant cavity light emitting diode or as a vertical cavity surface emitting laser.

With reference to FIG. 7, one of the resonant cavity light emitting devices 108 of FIG. 6A may be described in greater detail. In this exemplary device, the stack of group III-nitride layers 112 grown on the gallium nitride substrate 106 may include in order of epitaxial deposition: an optional n$^+$ GaN layer 114; a first mirror sub-stack 116 defining an n-type AlInGaN distributed Bragg reflector (DBR); an n-type GaAlInN cladding layer 118; an active region 120 including a GaAlInN multiple quantum well structure; a p-type GaAlInN cladding layer 122; a current spreading layer 124; and a second mirror sub-stack 126 defining a p-type AlInGaN distributed Bragg reflector (DBR).

Selected portions of upper epitaxially deposited layers 120, 122, 124, 126 may be lithographically removed, optionally along with removal of a portion of the thickness of the n-GaAlInN cladding layer 118, to define a device mesa 128 that may include a portion of the second mirror sub-stack 126 as shown in FIG. 7. The removal of material to define the device mesa 128 forms trenches in the stack of group III-nitride layers 112 that extend from an exposed surface of the stack 112 at least partway toward the single-crystal gallium nitride substrate 106. The trenches define laterally spaced islands of the active region 120. The device mesas 128 include the islands of the active region 120. Because the single-crystal gallium nitride substrate 106 may be free of tilt boundaries, portions of the single-crystal gallium nitride substrate 106 that extend between the device mesas 128 contain no edge dislocation arrays such as may form at low-angle tilt boundaries.

Electrical contact may be made by a frontside n-type electrode 130 contacting n-GaAlInN cladding layer 118, and by a frontside p-type electrode 132 contacting the current spreading layer 124. An insulating material 134, for example, $SiO_2$ or $SiN_x$, may be disposed between the electrodes 130, 132 to provide enhanced electrical isolation of the electrodes 130, 132 and to provide surface passivation. If the gallium nitride substrate 106 may be doped n-type, the frontside n-type electrode 130 can be replaced by a backside n-type electrode 136 contacting the substrate 106. For surface emitting lasers, the backside electrode 136 may be reflective, for example a Ti/Al metal stack. For a resonant cavity light emitting diode employing backside light emission, the backside electrode 136 may be light transmissive, for example including transparent indium tin oxide or a thin light-transmissive layer of metal. For backside light emission, the frontside n-electrode 130 may be employed.

Further device fabrication processing may be performed depending upon the desired end-use operation of the resonant cavity light emitting device 108. For example, to laterally define the optical cavity in a vertical cavity surface emitting laser, ion implanted regions 138 may be suitably formed by ion implantation. To define a circular aperture, for example, the ion implanted regions 138 form a circle defining the laser aperture. Similarly, to define a rectangular aperture, the ion implanted regions 138 form a rectangle defining the laser aperture.

The thicknesses and compositions of the various layers of the stack 112 of group III-nitride layers may be selected based on the desired wavelength of operation and other operating characteristics. For example, the light emission wavelength of the active region 120 may be determined by parameters such as thicknesses and compositions of the quantum wells and barriers. For 340 nanometers emission, a 2 nanometers $Al_{0.20}In_{0.04}Ga_{0.76}N$/7 nanometers $Al_{0.35}In_{0.07}Ga_{0.58}N$ quantum well may be suitable. For 460 nanometers emission, a 3 nanometers $In_{0.15}Ga_{0.85}N$/6 nanometers $In_{0.05}Ga_{0.95}N$ quantum well may be suitable. The precise compositions and layer thicknesses required to produce emission at a given wavelength may depend on the details of atomic-layer ordering of the AlInGaN material. It may be used to employ a single GaAlInN quantum well active region. Those skilled in the art can select other quantum well structures for light emission in the ultraviolet to blue wavelength range (for example, in a range of about 250 nanometers to about 500 nm) using literature values for parameters that may impact the emission wavelength, such as for bandgaps of the group III-nitride layers, for electron and hole effective masses, for conduction and valence band offsets at interfaces, and so forth.

The active region 120 can be undoped, p-type, n-type, or a combination thereof. In one embodiment, the quantum wells may be undoped while the barrier layers may be undoped or doped n-type. Because the lower bandgap quantum well materials such as InN, $In_xGa_{1-x}N$ and the like may decompose at lower temperatures than does GaN, these layers may be deposited at temperatures in a range of from about 650 degrees Celsius to about 1050 degrees Celsius.

In one embodiment, growth conditions of the quantum well of the active region 120 may be adjusted to promote three-dimensional or islanding growth to produce quantum dots rather than planar quantum well layers. In the metalorganic chemical vapor deposition epitaxial technique, indium-containing group III-nitride quantum dots can be grown by partial atomic layer epitaxy by cycling metallic precursors at selected intervals may between 1 microsecond and 1 minute, depending upon the growth temperature, such that the binary constituents may be deposited separately. Alternatively, the temperature, pressure, or other growth parameters can be adjusted based on solid solubility information obtained from the literature to deposit under conditions that lead to islanding.

Figure 8:
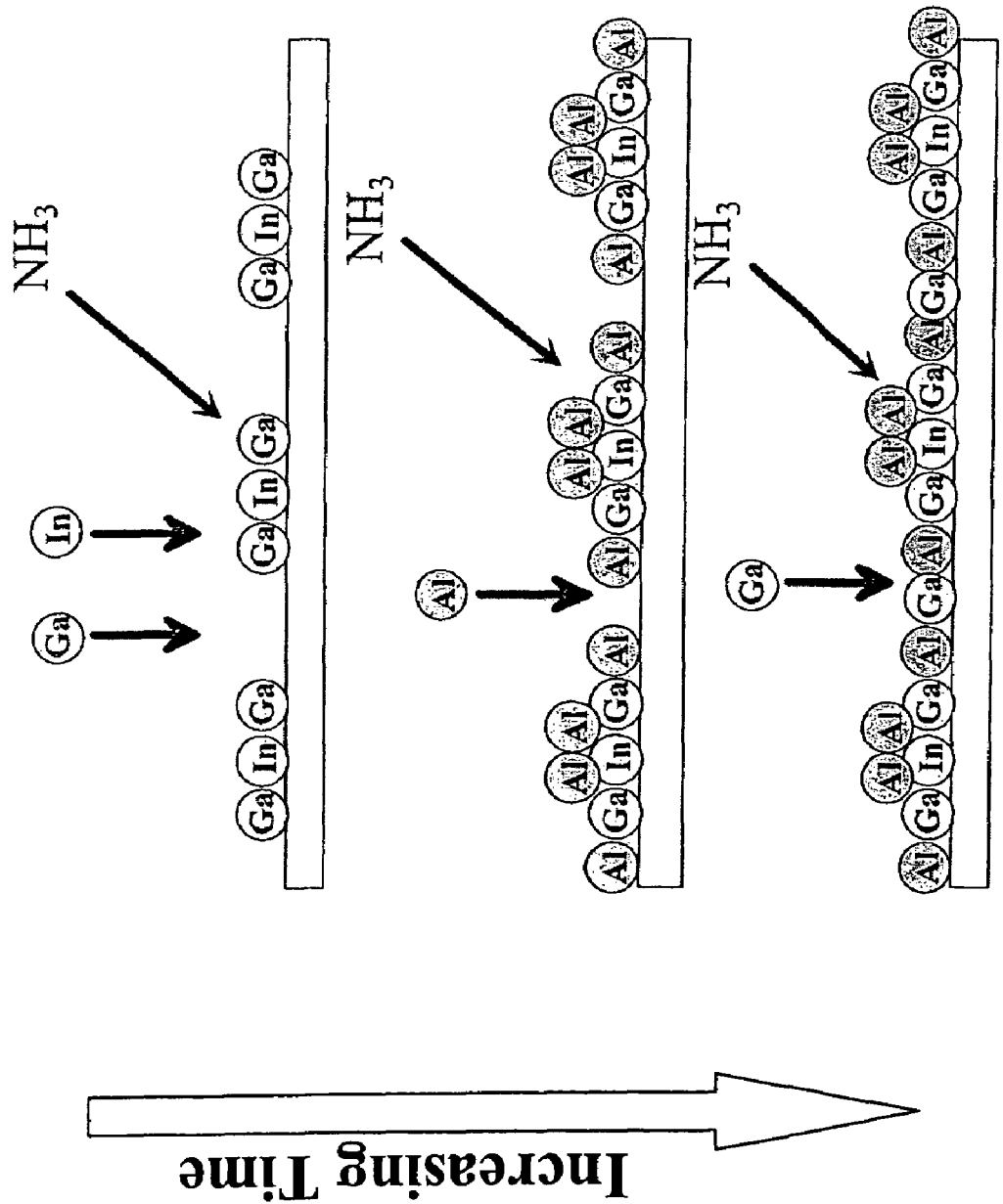
FIG. 8 diagrammatically shows a method for producing an active region including quantum dots of indium-containing group III-nitride material.

With reference to FIG. 8, one approach for producing indium-containing quantum dots may be described. As shown in the top part of FIG. 8, GaN may be deposited first to help capture Indium, forming an ordered layer of InGaN nucleation sites. This may be followed by AlN or AlGaN deposition shown in the middle part of FIG. 8. A high electronegativity of AlN allows the material to stick uniformly throughout the film, encapsulating and confining the indium containing quantum dots, as shown in the bottom part of FIG. 8. A size distribution of the quantum dots may be monodisperse. The standard deviation of quantum dot diameters may be less than 50 percent of the mean. In one embodiment, the standard deviation of quantum dot diameters may be less than about 20 percent of the mean. The composition of the quantum dots, such as the indium content, may be about constant. For example, a standard deviation in the indium content may be less than about 0.05. In one embodiment, the standard deviation in the indium content may be less than about 0.02. The quantum dots may be zero dimensional quantum confinement systems that may be more easily population-inverted versus quantum well layers, which may lead to a reduction in threshold voltage for laser operation.

With reference to FIG. 7, the cladding layers 118, 122 may be GaN or AlGaN and have a larger (or different) bandgap than the materials of the active region 120 to promote carrier confinement in the active region 120. The cladding layers may be may grown at between about 650 degrees Celsius and 1150 degrees Celsius by metalorganic chemical vapor deposition, and at between about 600 degrees Celsius and 900 degrees Celsius by molecular beam epitaxy. Optionally, the cladding layers 118, 122 may be multiple-layer stacks containing one or more indium-containing layers to promote electrical conductivity.

The optional current spreading layer 124 promotes lateral distribution of electrical current across the large area resonant cavity light emitting device 108. In one suitable embodiment, the current spreading layer 124 may be a superlattice including indium-containing layers. In another embodiment, the current spreading layer 124 may include a $p^+$ GaAlInN-to-$n^+$ GaAlInN tunnel junction, or a combination of a tunnel junction and a superlattice. In another embodiment, the current-spreading layer may include a transparent or semi-transparent metal oxide $MO_x$, where $0 \leq x \leq 2$. A suitable metal M may include one or more of indium, tin, zinc, gold, silver, copper, or nickel.

The mirror sub-stacks 116, 126 and the separation therebetween may be readily selected using literature values for optical constants of the group III-nitride layers to provide a resonant cavity at the selected light emission wavelength. For example, for a 405 nanometers wavelength the mirror sub-stacks 116, 126 suitably include alternating layers of GaN and AlN of about 39 nanometers and about 40 nanometers thickness, respectively. Such a DBR with sixteen periods may be estimated to have a reflectivity of about 99.5 percent at 405 nanometers. To reduce lattice mismatch strain, which may be relatively high as between GaN and AlN, indium-containing layers can be incorporated. For example, a thirty period $In_{0.15}Al_{0.70}Ga_{0.15}N$/GaN DBR can be designed to have a reflectivity estimated at 98.6 percent at 460 nanometers.

Other DBR structures may be adopted to achieve specific wavelengths and reflectivity characteristics. High optical contrast may achieved with dissimilar materials (for example, GaN/AlN) and low strain may achieved using alloys of more similar composition (for example, $In_{0.15}Al_{0.70}Ga_{0.15}N$/GaN) can be traded off at various intermediate compositions. The refractive index-thickness product of each layer may correspond to a quarter-wavelength for high reflectivity. Moreover, rather than using abrupt layer interfaces, graded interfaces or a graded superlattice can be employed to reduce electrical resistance. The total refractive index-thickness product of the material between the mirror sub-stacks 116, 126 suitably corresponds to an integral number of half-wavelengths of the emission wavelength, such as a half wavelength or a single wavelength. May, the mirror sub-stacks 116, 126 may be epitaxially deposited at temperatures between about 650 degrees Celsius and 1150 degrees Celsius for growth by metalorganic chemical vapor deposition, and between about 600 degrees Celsius and 900 degrees Celsius for growth by molecular beam epitaxy.

For operation as a resonant cavity light emitting diode in which light may be collected through the gallium nitride substrate 106, a reflectivity in a range of from about 0.4 to about 0.6 may be chosen for the first mirror sub-stack 116 defining the n-type AlInGaN DBR. However, if light may be collected from the epitaxial surface (that is, through the p-type DBR 126) then the n-DBR first mirror sub-stack 116 should have a reflectivity of at least about 0.8. For operation as a vertical cavity surface emitting laser, the reflectivity of the n-DBR first mirror sub-stack 116 should be in a range of from about 0.95 to about 0.99, or from about 0.99 to about 0.999.

For operation as a vertical cavity surface emitting laser, the ion implanted regions 138 may provide lateral cavity confinement. The ion implanted regions 138 define a lateral extent of the cavity that may be in a range of from about 1 micrometer to about 100 micrometers, corresponding to aperture areas that may be in a range of from about 1 square micrometer to about 8000 square micrometers for circular apertures. In one embodiment, the lateral extent may be in a range of from about 5 micrometers to about 20 micrometers corresponding to aperture areas that may be in a range of from about 20 square micrometers to about 315 square micrometers for circular apertures. For operation as a resonant cavity light emitting diode, lateral confinement may be optional. Ions such as $He^+$, $H^+$, $O^+$, $N^+$, $F^+$, metal ions, or the like, with an energy between 10 keV and 1 MeV and a fluence may be in a range of from about $10^{12}$ $cm^{-2}$ and $10^{14}$ $cm^{-2}$ may be implanted in the p-type GaAlInN cladding layer 122 to form the implanted regions 138. The implantation conditions may be selected to avoid substantial penetration of the ions into the active region 120. The ion implantation may be performed after the deposition and annealing of the electrodes 130, 132 so that the lattice damage introduced by the ion implantation may not be removed by the metallization processing.

Rather than defining the optical aperture using ion implantation, selective lateral oxidation can be employed. In this approach, an aluminum-rich group III-nitride layer may be incorporated into the p-type GaAlInN cladding layer 122. The group III content of the aluminum-rich group III-nitride layer may be greater than 75% aluminum, and the layer has a thickness that may be in a range of from about 5 nanometers and 50 nanometers. After mesa formation, the outer diameter of the aluminum-rich group III-nitride layer may be selectively oxidized by heating in an oxygen-containing atmosphere to convert outer portions of the aluminum-rich group III-nitride layer to $Al_2O_3$. The temperature and time of the oxidation process control the lateral extent of the aperture.

Figure 9:
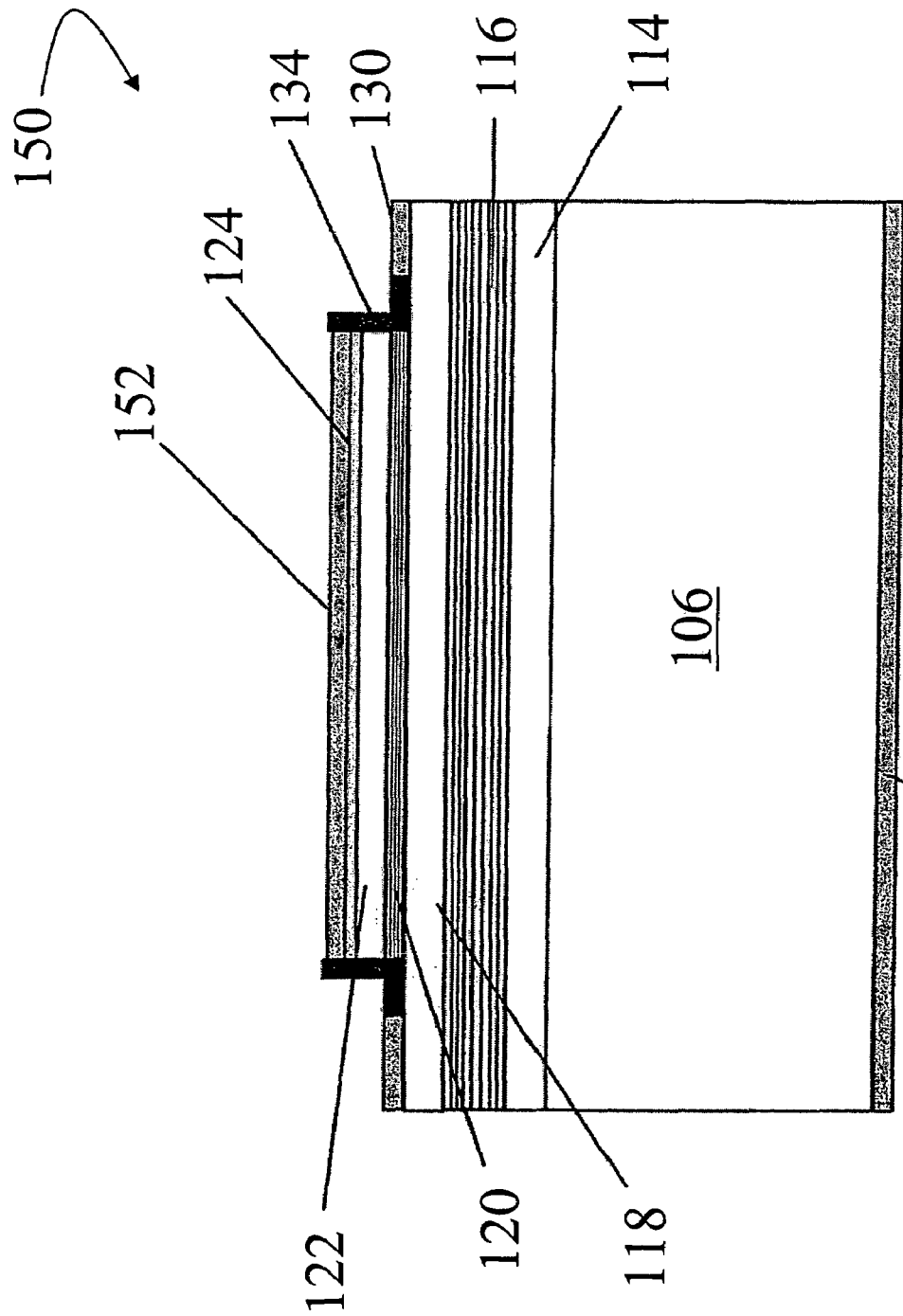
FIG. 9 shows an example resonant cavity light emitting diode layer structure having a reflective layer serving as an optical mirror and as a p-electrode.

With reference to FIG. 9, in one such adaptation suitable for a resonant cavity light emitting diode 150, the second mirror sub-stack 126 defining the p-type AlInGaN DBR may be replaced by a reflective mirror layer 152. A suitable mirror may include one or more metal. Suitable metals may include one or more of silver, gold, aluminum, platinum, rhodium, palladium, chromium, or the like. The mirror layer 152 may be deposited over the current spreading layer 124 (or directly onto the p-type GaAlInN cladding layer 122 if the current spreading layer 124 may be omitted) by thermal evaporation, electron beam evaporation, or another suitable technique. In this embodiment, the frontside n-type electrode 130 may allow unimpeded substrate-side light emission. Alternatively, the frontside n-type electrode 130 may be replaced by backside n-electrode 136; which may be light-transmissive, for example including transparent indium tin oxide or a thin light transmissive metal layer. Moreover, the reflective mirror layer 152 serves as the p-type electrode, so that the p-type electrode 132 of the resonant cavity light emitting device 108 of FIG. 7 may be omitted in the resonant cavity light emitting diode 150 of FIG. 9.

Figure 10:
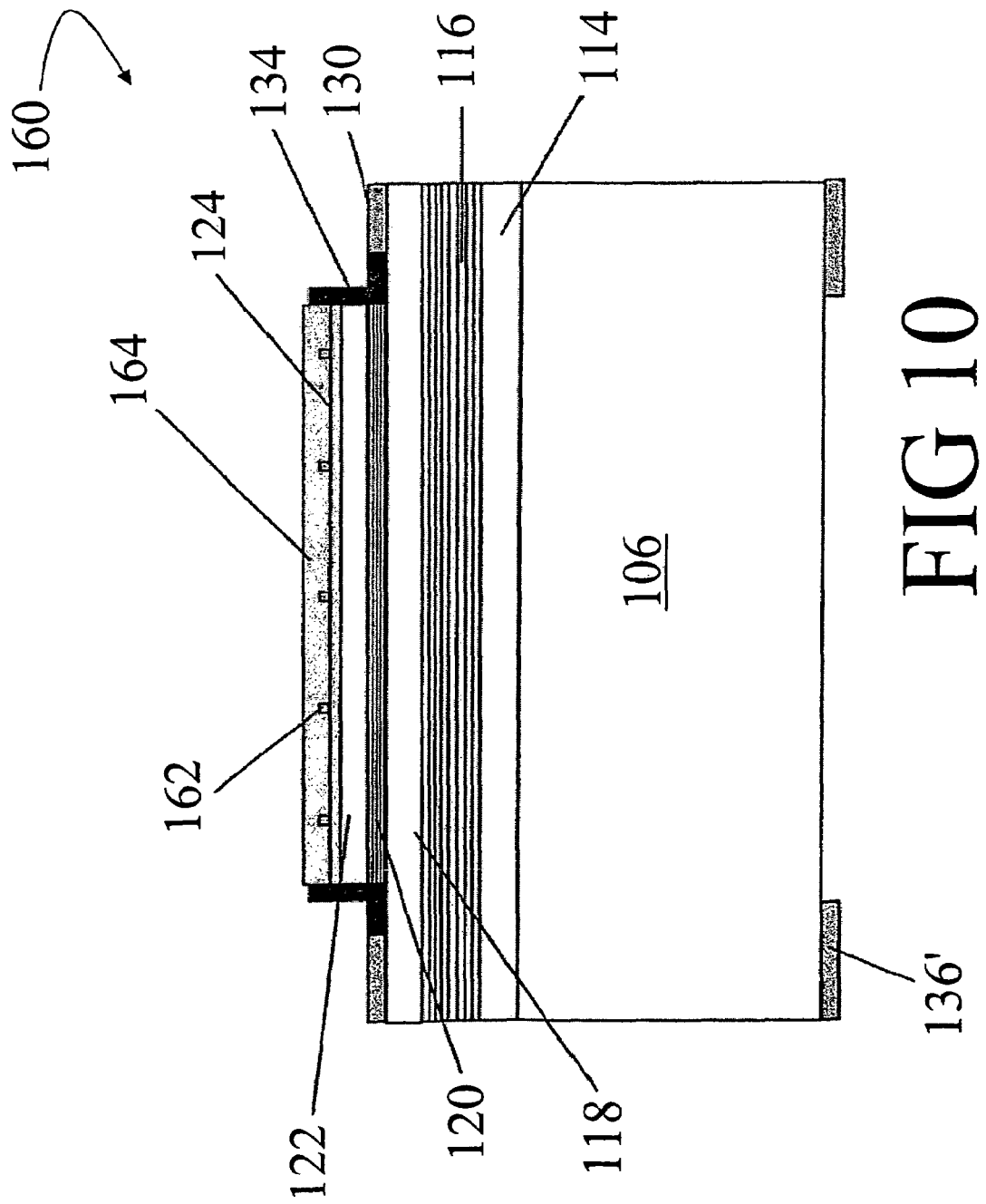
FIG. 10 shows an example resonant cavity light emitting diode layer structure having a reflective layer serving as an optical mirror disposed over a gridded p-electrode.

With reference to FIG. 10, another resonant cavity light emitting diode 160 may be described, which may be similar to the embodiment of FIG. 9 except that the reflective mirror layer 152 may be replaced by a two-component mirror/p-electrode including a discontinuous p-electrode 162 and a reflective mirror layer 164. The discontinuous p-electrode 162 may be optimized as an electrical contact and can be made, for example, of a nickel/gold or a platinum/gold stack where the nickel or platinum may be about 20 to 200 nanometers thick and the gold may be about 100 nanometers to 1 micrometer thick. In one suitable embodiment, the discontinuous p-electrode 162 may be a gridded electrode having grid openings may be in a range of from about 1 micrometer and 0.1 centimeters on a side. The reflective mirror layer 164 may be formed from the metals identified as useful in mirrors as disclosed herein. The mirror may be deposited over the current spreading layer 124 (or directly onto the p-type GaAlInN cladding layer 122 if the current spreading layer 124 may be omitted) and over the gridded p-electrode 162. The mirror layer 164 may be deposited after any annealing processing of the discontinuous p-electrode 162 to reduce interdiffusion. Optionally, a diffusion barrier layer such as nickel, rhodium, platinum, palladium, iridium, ruthenium, rhenium, tungsten, molybdenum, niobium, tantalum, or $MC_xN_yO_z$ (where M may include a metallic element such as aluminum, boron, silicon, titanium, vanadium, chromium, yttrium, zirconium, lanthanum, or a rare earth metal, and x, y, z may be each between 0 and 3) may be disposed between the discontinuous p-electrode 162 and the mirror layer 164. Rather than a grid configuration, the p-electrode 162 can be arranged as an array of dots, rectangles, circles, or the like. The separation between the p-electrode array elements may be between about 1 micrometer and 0.1 centimeters. The use of a reflective metal p-electrode 152 or combination of reflective mirror layer 164 and discontinuous electrode 162 enables fabrication of large area resonant cavity light emitting diodes, for example, 50 millimeter or larger, without necessitating lateral carrier transport through p-doped layers over large distances.

Moreover, in the resonant cavity light emitting diode 160 the backside n-electrode 136 may be modified as n-electrode 136' which may include an aperture opening for backside light emission. By providing the aperture opening, the n-electrode 136' may not be restricted to light-transmissive configurations. As another option, the backside n-electrode 136' can be replaced by the frontside n-electrode 130.

Figure 11:
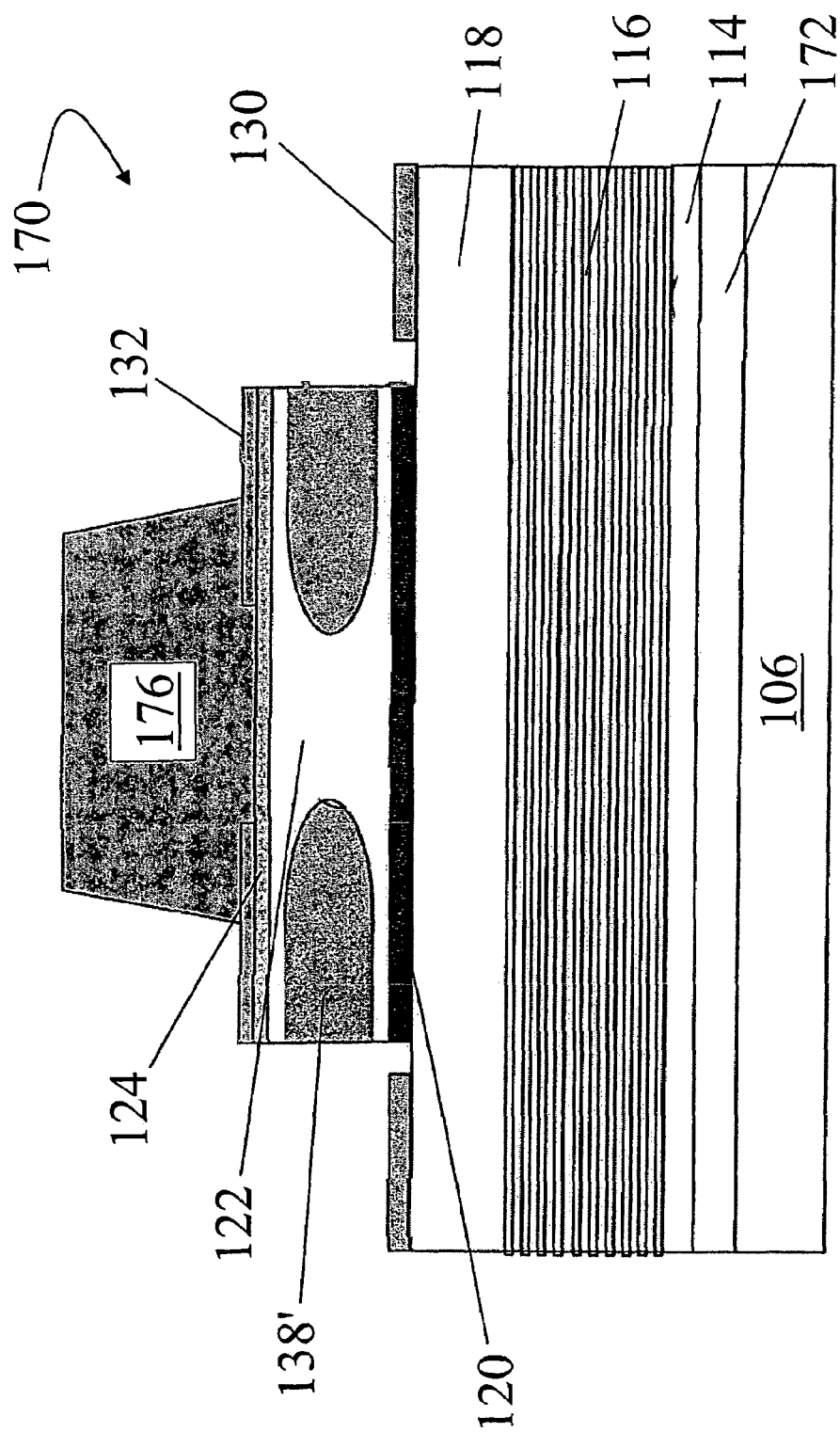
FIG. 11 shows an example resonant cavity light emitting device layer structure having a dielectric distributed Bragg reflector. This structure may be suitable for use as a resonant cavity light emitting diode or as a vertical cavity surface emitting laser.

With reference to FIG. 11, a resonant cavity light emitting device 170 that with specific layer materials, compositions, and thicknesses may be suitable for use as a resonant cavity light emitting diode or as a vertical cavity surface emitting laser may be described. The device 170 of FIG. 11 may be similar to the device 108 of FIG. 7, but has an optional current-spreading $n^+$ AlInGaN/AlInGaN superlattice 172 disposed between the gallium nitride substrate 106 and the optional $n^+$GaN layer 114. Ion implanted regions 138' correspond to ion implanted regions 138, and the optional insulating material 134 may be omitted in the device 170. The p-type second mirror sub-stack 126 may be replaced in the device 170 by a dielectric distributed Bragg reflector (DBR) stack 176.

Considerably higher refractive index contrasts may be achievable with the dielectric DBR stack 176 as compared with the InAlGaN sub-stack 126. The dielectric materials of the dielectric DBR stack 176 may be suitably metal oxides of the form $MO_xN_y$, where x and y may be each between 0 and 2 and M may include a metallic element such as silicon, titanium, hafnium, magnesium, aluminum, calcium, vanadium, chromium, yttrium, zirconium, or a rare earth metal. The refractive index-thickness product for each $MO_xN_y$ layer may be an odd multiple of a quarter-wavelength of the emission light, and may be more a quarter-wavelength of the emission light. The metal oxide films can be deposited by thermal evaporation, electron beam evaporation, sputtering, or the like. As one example, a 15 period stack of $HfO_2/SiO_2$ can be designed to provide a reflectivity of 0.9998 at a wavelength of 405 nm.

High reflectivities achievable by using the dielectric DBR stack 176 may be useful in vertical cavity surface emitting lasers, but may be used in resonant cavity light emitting diode devices. In vertical cavity surface emitting laser or resonant cavity light emitting diode embodiments, the p-mirror defined by the dielectric DBR stack 176 may be circular with a diameter may be in a range of from about 5 micrometers to about 200 micrometers corresponding to a device aperture area may be in a range of from about 20 square micrometers to about 31,000 square micrometers. The lateral extent of the dielectric DBR stack 176 may be defined by lithographic masking prior to deposition of the DBR stack 176, which may permit the p-electrode 132 to be deposited on top of the device after removal of the mask.

In one embodiment, where light may be collected through the gallium nitride substrate 106, the substrate may be doped with at least one luminescent atom or color center, for example, at least one of a transition or rare-earth metal such as Ti, V, Cr, Mn, Fe, Co, Ni, Zr, Hf, Pr, Eu, Er, or Tm. In another embodiment, a homoepitaxial layer of GaN containing at least one luminescent atom or color center may be deposited on the gallium nitride substrate, below the n-DBR, within the cavity, above the p-DBR, or on the backside of the substrate. The homoepitaxial layer may be deposited by methods that may be well known in the art, such as molecular beam epitaxy or metalorganic chemical vapor deposition. The dopant or color center may be present at a concentration of at least $10^{17}$ centimeters$^{-3}$ and emits or produces luminescence at one or more wavelengths in a range of from about 300 nm to about 1000 nm. In one embodiment, a portion of the light emitted by the resonant cavity device may be absorbed by the at least one luminescent atom or color center in the substrate, producing an electronically excited state. The excited state may relax, emitting light of a different color. The resonant cavity device may emit light at two or more different wavelengths without the use of a separate phosphor. For example, red-luminescing GaN crystals can be synthesized by doping with Eu. Combination of blue, blue-green, or green light emitted by the active layer of the resonant cavity device and red, orange, yellow, and/or green light emitted by the substrate can produce white light.

Figure 12:
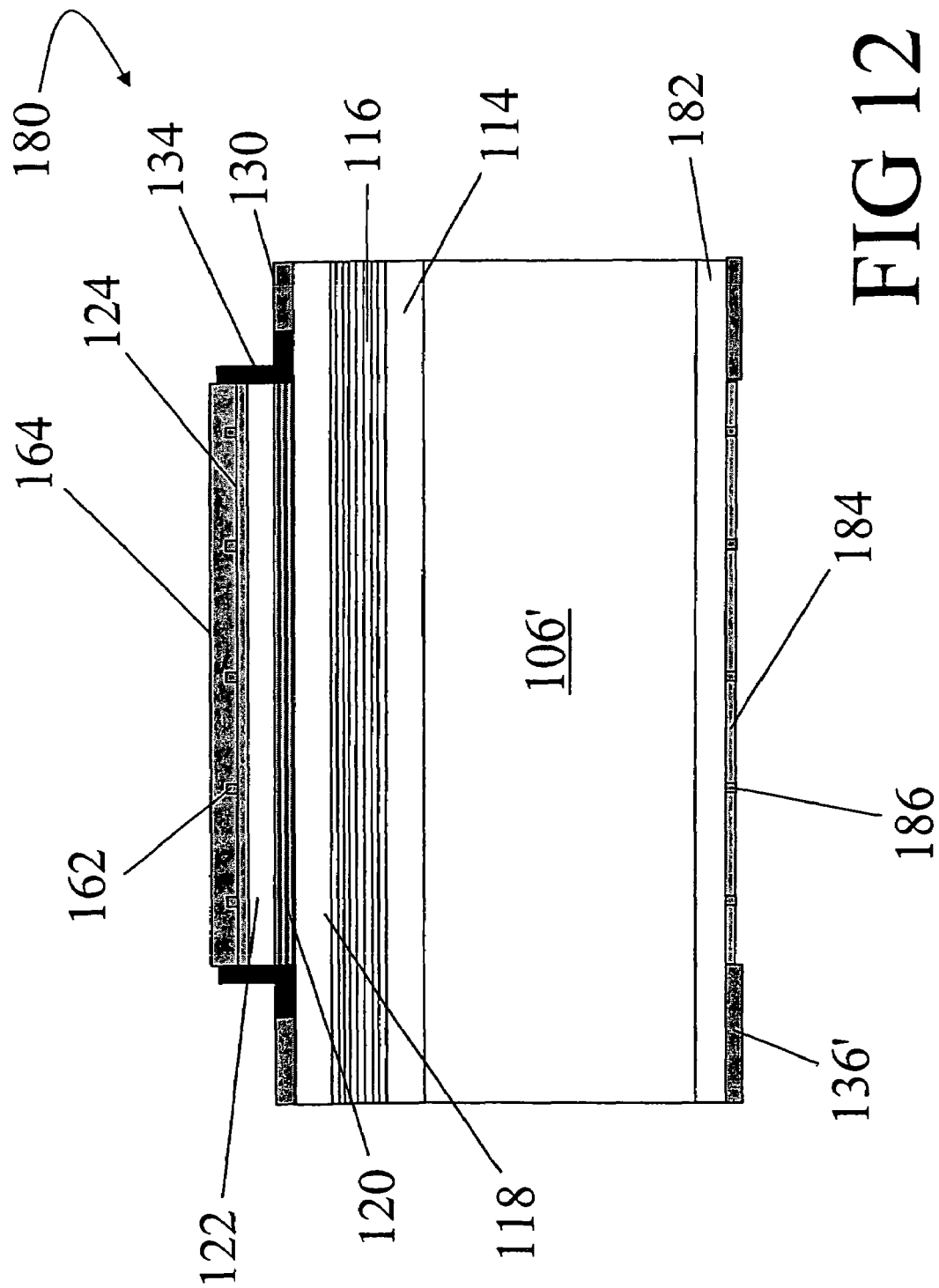
FIG. 12 shows an example resonant cavity light emitting device layer structure having a luminescent substrate or epitaxial layer and a secondary mirror defining a cavity for at least one additional wavelength of light.

With reference to FIG. 12, a resonant cavity light emitting diode 180 may be described, that may be similar to the resonant cavity light emitting diode 160 of FIG. 10 except for additional structure disposed on a backside of substrate 106'. Moreover, the substrate 106' may be similar to the substrate 106 of FIG. 10 except that the substrate 106' optionally may be doped with a luminescent dopant. A secondary cavity may be employed with the luminescent substrate 106' or with a luminescent layer 182 disposed on the backside of the substrate 106' in order to provide for directional emission of at least two wavelengths of light. The luminescent substrate 106' may be suitably a gallium nitride substrate containing at least one of a transition or rare-earth metal such as Ti, V, Cr, Mn, Fe, Co, Ni, Zr, Hf, Pr, Eu, Er, or Tm, free of tilt boundaries and having a dislocation density less than about $10^4$ cm$^{-2}$. In another embodiment, luminescence may be provided by the luminescent layer 182, which can be a GaN epitaxial layer doped with at least one of a transition or rare-earth metal such as Ti, V, Cr, Mn, Fe, Co, Ni, Zr, Hf, Pr, Eu, Er, or Tm. Luminescence at two or more wavelengths in addition to the primary wavelength emitted by the active layer may be achieved by doping with two or more metal atoms or color centers. The luminescent layer 182 may be deposited on the backside of the substrate, as shown in FIG. 12, or may be deposited between the substrate 106' and the n-DBR 116, within the primary cavity, or above the p-DBR if a p-DBR may be used for the p-type mirror. In another embodiment, luminescence may be provided by a second substrate (not shown) that may be wafer-bonded to the backside of the gallium nitride substrate by a suitable bonding method. Examples of such a second substrate include ruby (Ti-doped sapphire) and cerium-doped yttrium aluminum garnet.

In one embodiment, a second cavity may be provided for directional emission of one or more additional wavelengths of light from the luminescent substrate 106' or luminescent layer 182. A secondary mirror 184 may be deposited on the bottom side of the substrate or luminescent layer, as shown in FIG. 12. The mirror 182 may be wavelength-specific, such as a distributed Bragg reflector, or may be broadband, as with a thin, partially-reflecting metal layer such as a partially silvered layer. If a broadband secondary mirror may be employed, the n-DBR 116 between the substrate 106' and the active layer 120 may be optionally omitted. In one embodiment, improved electrical contact to the substrate 106' may be advantageously achieved using a two-component mirror/n-electrode including a discontinuous n-electrode 186 and the reflective mirror layer 184. The discontinuous n-electrode 186 may be optimized as an electrical contact and can be made, for example, of a titanium/aluminum, titanium/aluminum/titanium/gold, titanium/aluminum/nickel/gold, or titanium/aluminum/platinum/gold stack where the thickness of each layer in the stack may be between about 10 and about 2000 nanometers thick. The first Ti layer may be in a range of from about 10 nanometers to about 30 nanometers thick, the Al layer in a range of from about 50 to about 300 nanometers thick, and the outermost layers in a range of from about 30 to about 2000 nanometers thick. In one embodiment, the discontinuous n-electrode 186 may be a gridded electrode having grid openings may be in a range of from about 1 micrometer to about 0.5 centimeters on a side. The reflective mirror layer 184 may be made of silver, gold, aluminum, platinum, rhodium, palladium, chromium, or the like, and may be deposited over the luminescent substrate 106' or the luminescent layer 182 and over the gridded n-electrode 186. The mirror layer 184 may be deposited after any annealing processing of the discontinuous n-electrode 186 to reduce interdiffusion. Optionally, a diffusion barrier layer such as nickel, rhodium, platinum, palladium, iridium, ruthenium, rhenium, tungsten, molybdenum, niobium, tantalum, or $MC_xN_yO_z$ (where M may include a metallic element such as aluminum, boron, silicon, titanium, vanadium, chromium, yttrium, zirconium, lanthanum, or a rare earth metal, and x, y, z may be each between 0 and 3) may be disposed between the discontinuous n-electrode 186 and the mirror layer 184. Rather than a grid configuration, the discontinuous n-electrode 186 can be arranged as an array of dots, rectangles, circles, or the like. The separation between the n-electrode array elements may be between about 1 micrometer and 0.5 centimeters. To promote efficient light emission over the device, the front and back surfaces of the substrate 106' and the luminescent layer 182, if employed, should be parallel to less than $0.1\lambda$, where $\lambda$ may be the smallest wavelength of the light resonating in the secondary cavity. The thickness of the cavity and/or the luminescent layer 182 should be chosen so that the optical thickness may be an integral number of half-wavelengths. If two or more different wavelengths may be to be confined by the cavity, the wavelengths and thickness should be chosen so that the optical thickness may be an integral number of one-half of each wavelength. With the cavities defined as in FIG. 12, the cavity for the secondary wavelength or wavelengths also may include the cavity for the primary light emitted by the active layer. The optical path length of the primary cavity may be taken into account for the optical path length of the secondary cavity but will otherwise not introduce major complications since the secondary wavelengths will be off-resonance for the primary cavity (via the n-DBR). In FIG. 12, the primary cavity may be defined by the p-mirror 164 and the n-DBR 116, while the secondary cavity may be defined by the p-mirror 164 and the partially reflective mirror layer 184. Thus, the primary and secondary cavities may be defined by two metallized mirrors and one DBR. In various other contemplated embodiments, various combinations of 1 to 3 AlInGaN DBRs, 0 to 2 mixed-oxide DBRs, and 0 to 2 metallic or partially-metallized mirrors may be used to define the primary optical cavity and optionally the secondary optical cavity, and light may be emitted either through the substrate or through the top mirror.

The exemplary resonant cavity light emitting devices 108, 150, 160, 170, 180 have a p-on-n configuration: that is, the n-type material may be adjacent the gallium nitride substrate 106, 106' while the p-type material may be distal from the gallium nitride substrate 106, 106'. For backside electrical contact, the gallium nitride substrate should be conductive, doped n-type by including a suitable dopant source in the capsule 10 such as a silicon or oxygen precursor. The doping produces a substrate resistivity of less than 10 ohm-cm, and more of less than 1 ohm-cm. For devices employing frontside contacts, the gallium nitride substrate can be n-type, undoped, or p-type, but may be n-type with electrical resistivity less than about 10 ohm-cm. Devices with an n-on-p configuration may be used. For n-on-p devices, the gallium nitride substrate should be p-type and the polarities of the InAlGaN layers 112 and electrical contacts 130, 132, and 136 should be inverted.

The resonant cavity light emitting devices 108, 150, 160, 170, 180 may be exemplary only. The devices may include one or more additional and/or differing layers to implement specific electrical, optical, or structural features, by removing layers of limited value for a specific device application, and so forth. Although uniform group III-nitride layers may be shown, it may be used to incorporate graded layers into the resonant cavity light emitting device structures, for example to improve vertical current flow.

The resonant cavity light emitting devices 108, 150, 160, 170, 180, or similar devices, include or may be fabricated on the low dislocation density gallium nitride substrate 106, 106' which has no tilt boundaries. These devices have substantial advantages over similar devices including or fabricated on other substrates such as higher dislocation density gallium nitride substrates with dislocation densities in excess of $10^4$ $cm^{-2}$, epitaxial lateral overgrowth gallium nitride substrates having high densities of tilt boundaries, or dissimilar (that is, non-gallium nitride) substrates such as sapphire or silicon carbide substrates. Residual stress or strain resulting from the presence of tilt boundaries or a dissimilar substrate can accelerate the degradation of laser diodes or high power resonant cavity light emitting diodes. Similarly, dislocations may reduce the lifetime of resonant cavity light emitting devices.

The relatively thick epitaxial DBR layers in resonant cavity devices can generate significant strain and lead to cracks, which may nucleate at tilt boundaries or dislocations. The use of a strain- and tilt-boundary-free GaN substrate, with zero lattice- and thermal-expansion mismatch and extremely low dislocation density will minimize the likelihood of crack formation. The substrate produced by the presently described superheated fluid-mediated recrystallization process may be particularly advantageous for resonant cavity light emitting devices that have thick epitaxial layer stacks compared with typical light emitting diodes and edge-emitting laser diodes.

The resonant cavity light emitting devices described herein can be mounted in conventional fashion in which light may be extracted from the frontside of the device. Alternatively, the substantial transparency of the gallium nitride substrate supports operation in a flip-chip arrangement in which light may be extracted from the backside of the resonant cavity light emitting device. Such a device can be mounted using flip chip bonding of front side p-type and n-type contacts, thus eliminating wire bonding or the like. Alternatively, the resonant cavity light emitting device can be flip-chip bonded using a single frontside contact, and a backside contact may be made by wire bonding or the like to a conductive substrate.

Figure 13:
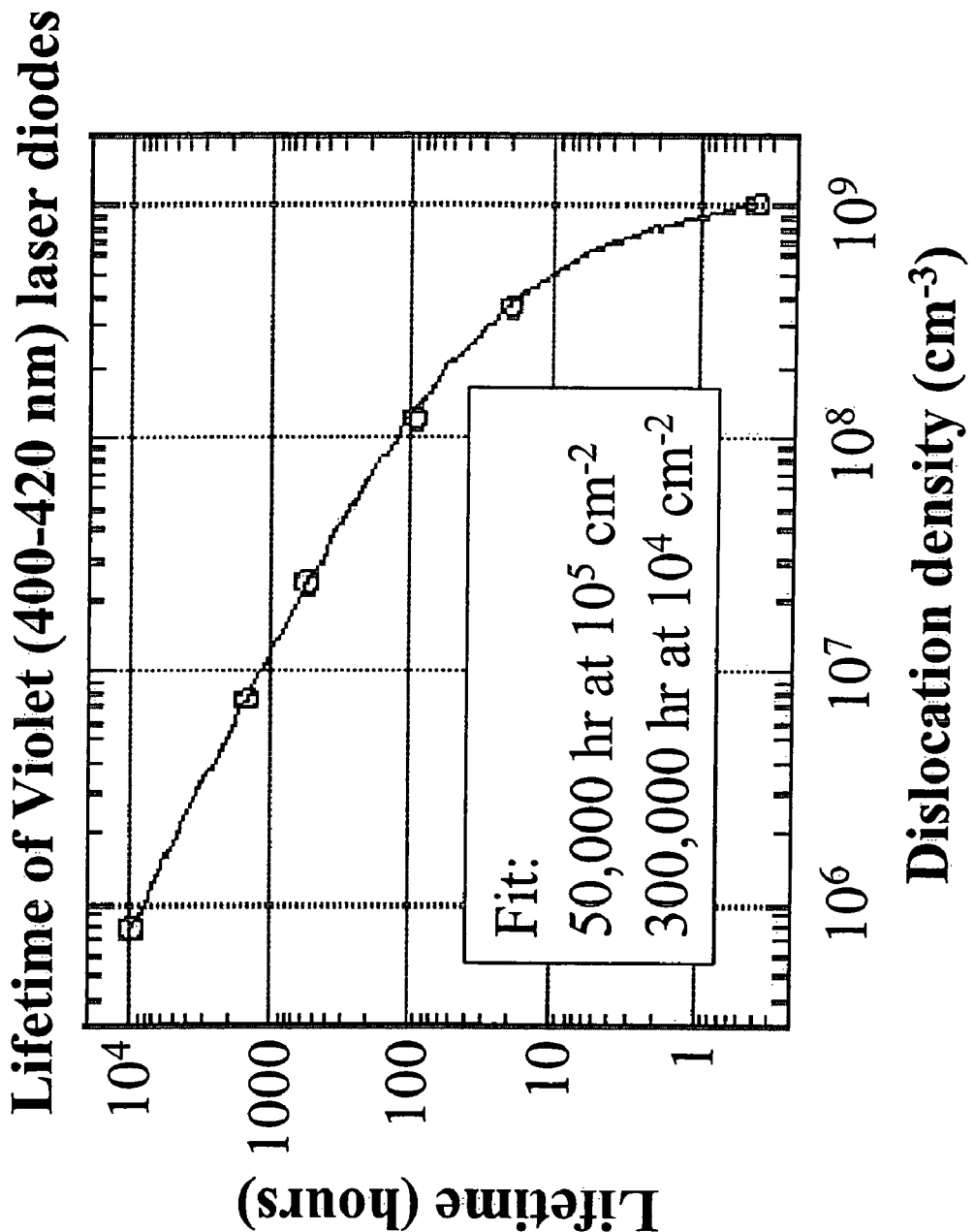
FIG. 13 plots device lifetime versus dislocation density for edge emitting laser diodes emitting in a wavelength range of 400-420 nm.

With reference to FIG. 13, the effect of dislocation density on the lifetime of edge-emitting laser diodes may be illustrated. Device lifetime may be seen to decrease rapidly with increasing dislocation density. Similar behavior may be expected of resonant cavity light emitting diodes and vertical cavity surface emitting lasers, particularly when operated at similar current densities. Degradation of device lifetimes by dislocations may result from dislocation-enhanced impurity diffusion into the active layer, from facile generation of new dislocations, or the like. Dislocations also can act as non-radiative recombination centers, electrical shunt paths, or the like, which degrade light emission efficiency. The presence of even a single dislocation within a group III-nitride based resonant cavity light emitting device can degrade its performance and/or lifetime.

With reference to FIG. 6A, the individual devices 108 fabricated on the single-crystal gallium nitride wafer 106 may be separated by dicing the gallium nitride wafer 106, and the individual device die may be die-bonded to a sub-mount and epoxy encapsulated, or otherwise packaged as discrete light emitting devices. For white light sources, the devices 108 may be coated with a phosphor-containing epoxy or otherwise optically communicate with a white-light producing phosphor.

With reference to FIG. 14, the gallium nitride substrate 106, or a portion thereof containing a selected array of the resonant cavity light emitting devices 108, may be utilized as a light emitting array component 200. In this embodiment, the devices 108 may be configured for backside light emission and employ frontside electrical contacts. Electrical contact may be suitably made using a probing card 202 having individually addressable p-contact points 204 that mate with corresponding p-electrodes 132, which may extend over the p-type mirror as shown, for example, in the devices 150, 160 of FIGS. 9 and 10. The probing card 202 may be disposed over the frontside (that is, the side on which the devices 108 may be disposed) of the gallium nitride substrate 106 as indicated by the arrow 206. The array of resonant cavity light emitting devices share a common n-contact 130, as shown in the devices 150, 160 of FIGS. 9 and 10, in the shape of a grid. Optionally, an optical coupling element 210 may be disposed over the backside of the gallium nitride substrate 106. The optical coupling element 210 can be an epoxy film or other index-matching film, an index-matching light-transmissive cover, or the like. Rather than the illustrated continuous optical coupling element 210, individual lensing elements corresponding to the devices 108 can arranged on the backside of the substrate 106. Light may be extracted from the backside of the gallium nitride substrate 106, as diagrammatically indicated by arrows 212.

The embodiments described herein are examples of compositions, structures, systems, and methods having elements corresponding to the elements of the invention recited in the claims. This written description may enable one of ordinary skill in the art to make and use embodiments having alternative elements that likewise correspond to the elements of the invention recited in the claims. The scope thus may include compositions, structures, systems and methods that do not differ from the literal language of the claims, and further may include other compositions, structures, systems and methods with insubstantial differences from the literal language of the claims. While only certain features and embodiments have been illustrated and described herein, many modifications and changes may occur to one of ordinary skill in the relevant art. The appended claims are intended to cover all such modifications and changes.

The invention claimed is:

1. A method for producing a resonant cavity light emitting device, the method comprising:
arranging a seed gallium nitride crystal and a source material in a nitrogen-containing superheated fluid in a container disposed in a multiple-zone furnace, the nitrogen-containing superheated fluid providing a medium for mass transport of gallium nitride precursors between the seed gallium nitride crystal and the source material, wherein the seed gallium nitride crystal has a dislocation density below $10^5$ cm$^{-2}$ and is substantially free of tilt boundaries,
preparing a surface of the seed gallium nitride crystal, comprising applying a first thermal profile between the seed gallium nitride crystal and the source material while the seed gallium nitride crystal and the source material are arranged in the nitrogen-containing superheated fluid, wherein the first thermal profile includes a first temperature gradient between the seed gallium nitride crystal and the source material;
growing gallium nitride material on the prepared surface of the seed gallium nitride crystal, the growing comprising applying a second thermal profile having a second temperature gradient that is different from the first temperature gradient between the seed gallium nitride crystal and the source material while the seed gallium nitride crystal and the source material are arranged in the nitrogen-containing superheated fluid, said growing producing a single-crystal gallium nitride substrate; and
depositing a stack of group III-nitride layers on the single-crystal gallium nitride substrate, the stack comprising a first mirror sub-stack and an active region adaptable for fabrication into one or more resonant cavity light emitting devices.

2. The method as defined in claim 1, wherein the preparing of the surface of the seed gallium nitride crystal includes etching the seed gallium nitride crystal.

3. The method as defined in claim 2, wherein:
the first thermal profile comprises a positive temperature gradient directed from the seed gallium nitride crystal toward the source material; and
the second thermal profile comprises a negative temperature gradient directed from the seed gallium nitride crystal toward the source material.

4. The method as defined in claim 1, wherein the preparing of the surface of the seed gallium nitride crystal further comprises: applying the first thermal
profile to effect a growing of gallium nitride crystal on the seed gallium nitride crystal at a growth rate that is slower than a growth rate effected by the applying of the second thermal profile.

5. The method as defined in claim 1, further comprising transitioning from the first thermal profile to the second thermal profile over a determined time interval to produce an increasing growth rate of gallium nitride on the seed gallium nitride crystal over the time interval.

6. The method as defined in claim 1, wherein the first thermal profile and the second thermal profile have temperature gradients of opposing direction.

7. The method as defined in claim 1, wherein the container is fabricated from at least one material selected from the group consisting of copper, gold, silver, palladium, platinum, iridium, ruthenium rhodium, osmium, niobium, molybdenum, tantalum, tungsten, rhenium and nickel alloy.

8. The method as defined in claim 7, wherein:
a temperature differential of the seed gallium nitride crystal and the source material is larger in the second thermal profile than a temperature differential in the first thermal profile.

9. The method as defined in claim 7, further comprising arranging an ammonium chloride mineralizer and/or an ammonium fluoride mineralizer in the nitrogen-containing superheated fluid for promoting dissolving of gallium nitride into the nitrogen-containing superheated fluid during the preparing and growing, wherein the second thermal profile has a temperature gradient chosen so that etching of the source material and growth on the seed gallium nitride takes place.

10. The method as defined in claim 7, further comprising arranging an ammonium fluoride mineralizer in the nitrogen-containing superheated fluid, the mineralizer being capable of facilitating dissolution of gallium nitride into the nitrogen-containing superheated fluid.

11. The method as defined in claim 1, further comprising arranging a luminescent dopant comprising at least one of a transition metal and a rare earth metal in one of the nitrogen-containing superheated fluid and the gallium nitride source material.

12. The method as defined in claim 1, further comprising subsequent to the depositing of the stack, fabricating a plurality of resonant cavity light emitting devices thereon.

13. The method as defined in claim 12, further comprising dicing the single-crystal gallium nitride substrate to separate the plurality of resonant cavity light emitting devices from each other.

14. The method as defined in claim 1, further comprising, prior to the depositing of the stack, slicing the single-crystal gallium nitride substrate into a plurality of about planar wafers, wherein the depositing of the stack includes depositing the stack on at least one of the plurality of wafers.

15. The method as defined in claim 14, wherein the slicing produces a plurality of about planar (0001) oriented wafers each having (0001) and (0001) oriented surfaces on opposing sides of the wafer, the method further comprising:
polishing one of the (0001) oriented surface and the (0001) oriented surface of a selected (0001) oriented wafer, the stack being deposited on the polished surface.

16. The method as defined in claim 14, wherein the slicing produces a plurality of about planar (1100) oriented wafers.

17. The method as defined in claim 14, wherein the slicing produces a plurality of about planar (1120) oriented wafers.

18. The method as defined in claim 1, wherein the superheated fluid is at a determined temperature and pressure such that the superheated fluid is supercritical.

19. A method, comprising:
arranging a seed gallium nitride crystal and a source material in a nitrogen-containing superheated fluid disposed in a sealable container disposed in a multiple-zone furnace;
growing gallium nitride material on the seed gallium nitride crystal by mass transport from the source material to the seed gallium nitride crystal through the nitrogen-containing superheated fluid, said growing producing a single-crystal gallium nitride substrate secured to the seed gallium nitride crystal, said growing comprising applying a temporally varying thermal gradient between the seed gallium nitride crystal and the source material to produce an increasing growth rate during at least a portion of the growing; and depositing a stack of group III-nitride layers on the single-crystal gallium nitride substrate, the stack comprising a first mirror sub-stack and an active region adaptable for fabrication into one or more resonant cavity light emitting devices.

20. The method as defined in claim 19, wherein the applying of a temporally varying thermal gradient to produce an increasing growth rate during at least a portion of the growing includes:
reversing a direction of the thermal gradient during the temporal varying.

21. The method as defined in claim 19, wherein the depositing of the stack of group III-nitride layers on the single-crystal gallium nitride substrate includes:
depositing the stack of group III-nitride layers by one of metal-organic chemical vapor deposition and molecular beam epitaxy.

22. The method as defined in claim 19, further comprising:
slicing the single-crystal gallium nitride substrate into a plurality of wafers; and
polishing a surface of a selected wafer, the depositing of the stack of group III-nitride layers being performed on the polished surface of the selected wafer.

23. The method as defined in claim 19, wherein the depositing of the stack of group III-nitride layers on the single-crystal gallium nitride substrate includes:
depositing a second mirror sub-stack, the first mirror sub-stack and the second mirror sub-stack defining a resonant cavity surrounding the active region.

24. The method as defined in claim 19, further comprising:
depositing a reflector of a material other than a group III-nitride material on the stack, the first mirror sub-stack and the reflector defining a resonant cavity surrounding the active region.

25. The method as defined in claim 19, further comprising:
processing the stack of group III-nitride layers to define a plurality of light emitting devices secured to the single-crystal gallium nitride substrate, the plurality of light emitting devices being selected from a group consisting of a plurality of resonant cavity light emitting diodes and a plurality of vertical cavity surface emitting lasers.

26. A system for producing a resonant cavity light emitting device, comprising
means for arranging a seed gallium nitride crystal and a source material in a nitrogen-containing superheated fluid in a container disposed in a multiple-zone furnace, the nitrogen-containing superheated fluid providing a medium for mass transport of gallium nitride precursors between the seed gallium nitride crystal and the source material;
means for applying a first thermal profile between the seed gallium nitride crystal and the source material while the seed gallium nitride crystal and the source material are arranged in the nitrogen-containing superheated fluid to prepare a surface of the seed gallium nitride crystal;
means for growing gallium nitride material on the prepared surface of the seed gallium nitride crystal, the growing comprising applying a second thermal profile that is different from the first thermal profile between the seed gallium nitride crystal and the source material while the seed gallium nitride crystal and the source material are arranged in the nitrogen-containing superheated fluid, said growing producing a single-crystal gallium nitride substrate; and
means for depositing a stack of group III-nitride layers on the single-crystal gallium nitride substrate, the stack comprising a first mirror sub-stack and an active region adaptable for fabrication into one or more resonant cavity light emitting devices.

27. A method for producing a resonant cavity light emitting device, the method comprising:
a) arranging a seed gallium nitride crystal and a source material in a nitrogen-containing superheated fluid in a container disposed in a multiple-zone furnace, the nitrogen-containing superheated fluid providing a medium for mass transport of gallium nitride precursors between the seed gallium nitride crystal and the source material;
b) etching a surface of the seed gallium nitride crystal; then
c) growing gallium nitride material on the etched surface of the seed gallium nitride crystal, said growing producing a single-crystal gallium nitride substrate; and
d) depositing a stack of group III-nitride layers on the single-crystal gallium nitride substrate, the stack comprising a first mirror sub-stack and an active region adaptable for fabrication into one or more resonant cavity light emitting devices.

28. The method of claim 27 wherein the step (b) of etching the surface of the seed gallium nitride crystal comprises applying a first thermal profile between the seed gallium nitride crystal and the source material while the seed gallium nitride crystal and the source material are arranged in the nitrogen-containing superheated fluid wherein the temperature of the seed gallium nitride crystal is lower than the temperature of the source material.

29. The method of claim 28 wherein the step (c) of growing the gallium nitride material on the etched surface of the seed gallium nitride crystal comprises applying a second thermal profile while the seed gallium nitride crystal and the source material are arranged in the nitrogen-containing superheated fluid, wherein the temperature of the seed gallium nitride crystal is higher than the temperature of the source material.

30. A method for producing a resonant cavity light emitting device, the method comprising:
arranging a seed gallium nitride crystal and a source material in a nitrogen-containing superheated fluid in a container disposed in a multiple-zone furnace, the nitrogen-containing superheated fluid providing a medium for mass transport of gallium nitride precursors between the seed gallium nitride crystal and the source material, wherein the seed gallium nitride crystal has a dislocation density below $10^5$ cm$^{-2}$;
further providing a halide salt mineralizer comprising at least one NH$_4$F and NH$_4$Cl in the nitrogen-containing superheated fluid for promoting dissolving of gallium nitride into the nitrogen-containing superheated fluid;
growing gallium nitride material on the surface of the seed gallium nitride crystal, said growing producing a single-crystal gallium nitride boule; and
depositing a stack of group III-nitride layers on a single-crystal gallium nitride wafer, said wafer having been prepared from the single-crystal gallium nitride boule, the stack comprising a first mirror sub-stack and an active region adaptable for fabrication into one or more resonant cavity light emitting devices.

31. The method as defined in claim 30, further comprising arranging a luminescent dopant comprising at least one of a transition metal and a rare earth metal in one of the nitrogen-containing superheated fluid and the gallium nitride source material.

32. The method as defined in claim 30, further comprising subsequent to the depositing of the stack, fabricating a plurality of resonant cavity light emitting devices thereon.

* * * * *